US010755679B2

United States Patent
Lin et al.

(10) Patent No.: US 10,755,679 B2
(45) Date of Patent: Aug. 25, 2020

(54) GATE DRIVING CIRCUIT AND DISPLAY PANEL

(71) Applicant: HannStar Display Corporation, Taipei (TW)

(72) Inventors: Sung-Chun Lin, Tainan (TW); Chien-Ting Chan, Tainan (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 232 days.

(21) Appl. No.: 15/951,159

(22) Filed: Apr. 11, 2018

(65) Prior Publication Data

US 2019/0073987 A1    Mar. 7, 2019

(30) Foreign Application Priority Data

Sep. 6, 2017  (CN) .......................... 2017 1 0796338

(51) Int. Cl.
| | |
|---|---|
| *G11C 19/00* | (2006.01) |
| *G09G 5/393* | (2006.01) |
| *G06T 1/60* | (2006.01) |
| *G09G 3/20* | (2006.01) |
| G09G 3/36 | (2006.01) |
| G11C 19/28 | (2006.01) |

(52) U.S. Cl.
CPC .............. *G09G 5/393* (2013.01); *G06T 1/60* (2013.01); *G09G 3/20* (2013.01); *G09G 3/3677* (2013.01); *G09G 2310/0251* (2013.01); *G09G 2310/0286* (2013.01); *G09G 2310/061* (2013.01); *G09G 2310/08* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 9,286,846 B2* | 3/2016 | Yu | ........................ G09G 3/3648 |
| 9,589,536 B2 | 3/2017 | Liu et al. | |
| 2007/0217564 A1* | 9/2007 | Tobita | ..................... G11C 19/28 |
| | | | 377/64 |
| 2014/0037043 A1* | 2/2014 | Yoon | ...................... G11C 19/00 |
| | | | 377/64 |

(Continued)

FOREIGN PATENT DOCUMENTS

| | | |
|---|---|---|
| CN | 102708776 A | 10/2012 |
| CN | 104732945 A | 6/2015 |

(Continued)

*Primary Examiner* — Tuan T Lam
(74) *Attorney, Agent, or Firm* — CKC & Partners Co., LLC

(57) ABSTRACT

A gate driving circuit and a display panel with the gate driving circuit are provided. The gate driving circuit includes shift registers. The shift registers are configured to respectively provide scan signals to gate lines of a display panel. One of the shift registers includes a pre-charge unit, a pull-up unit and a reset unit. The pre-charge unit is coupled to a first node and is configured to output a pre-charge signal to the first node. The pull-up unit is coupled to the first node and a second node and is configured to output one of the scan signals to the second node. The reset unit is coupled to the first node and the second node and is configured to receive a reset signal. A voltage level of the reset signal switches after the gate driving circuit scans the gate lines sequentially in a frame period.

18 Claims, 15 Drawing Sheets

(56) References Cited

U.S. PATENT DOCUMENTS

| | | | | |
|---|---|---|---|---|
| 2014/0253424 | A1* | 9/2014 | Yu | G11C 19/28 345/100 |
| 2015/0102991 | A1* | 4/2015 | Yu | G09G 3/3648 345/100 |
| 2015/0213762 | A1* | 7/2015 | Xia | G09G 3/3266 345/215 |
| 2015/0279480 | A1* | 10/2015 | Murakami | G09G 3/20 345/100 |
| 2016/0155409 | A1* | 6/2016 | Jeoung | G09G 5/003 345/214 |
| 2016/0155422 | A1* | 6/2016 | Sun | G09G 3/20 345/213 |
| 2016/0187917 | A1* | 6/2016 | Lou | G09G 3/2096 345/213 |
| 2016/0365034 | A1* | 12/2016 | Chan | G11C 19/28 |
| 2017/0018244 | A1* | 1/2017 | Jen | G09G 3/3677 |
| 2018/0137831 | A1* | 5/2018 | Murakami | G09G 3/20 |
| 2018/0190206 | A1* | 7/2018 | Su | G09G 3/3266 |
| 2019/0066562 | A1* | 2/2019 | Hu | G09G 3/20 |
| 2019/0073939 | A1* | 3/2019 | Hu | G09G 3/2092 |

FOREIGN PATENT DOCUMENTS

| | | |
|---|---|---|
| CN | 106340273 A | 1/2017 |
| CN | 106935168 A | 7/2017 |
| KR | 20140096613 A | 8/2014 |

\* cited by examiner

GATE DRIVING CIRCUIT AND DISPLAY PANEL

RELATED APPLICATIONS

This application claims priority to Chinese Application Serial Number 201710796338.6 filed Sep. 6, 2017, which is herein incorporated by reference.

BACKGROUND

Field of Invention

The present invention relates to a gate driving circuit, and more particularly to a gate driving circuit with voltage level reset function and a display panel that has the gate driving circuit.

Description of Related Art

A flat panel display device, such as a liquid crystal display (LCD) device or an organic light-emitting diode (OLED) display device, generally has a lot of shift registers for controlling gray levels of all pixels displayed in the display device at the same time point. On the other hand, the accuracy of signals correspondingly outputted at each time point has to be considered in an electrical circuit design of a shift register for ensuring image display quality of a display device with such shift register. However, if the waveforms of the scan signals outputted by the shift registers output have errors, the display device will be caused to display incorrect image data. In addition, a high-definition (HD) flat panel display device is likely to have an image display problem caused by noise interference on the shift registers.

SUMMARY

An objective of the invention is to provide a gate driving circuit and a display panel with the gate driving circuit, which have voltage level reset function, which can prevent the shift registers from being affected by noise interferences to output abnormal scan signals, ensuring that the display panel displays correct images in each frame period.

One aspect of the invention is directed to a gate driving circuit which includes $1^{st}$ to $N^{th}$ stage shift registers, where N is an integer greater than 1. The $1^{st}$ to $N^{th}$ stage shift registers are configured to respectively provide $1^{st}$ to $N^{th}$ stage scan signals to $1^{st}$ to $N^{th}$ gate lines of a display panel. An $i^{th}$ stage shift register of the $1^{st}$ to $N^{th}$ stage shift registers includes a pre-charge unit, a pull-up unit and a reset unit. The pre-charge unit is coupled to a first node and is configured to output a pre-charge signal to the first node. The pull-up unit is coupled to the first node and a second node and is configured to output an $i^{th}$ stage scan signal of the $1^{st}$ to $N^{th}$ stage scan signals to the second node. The reset unit is coupled to the first node and the second node and is configured to receive a reset signal. A voltage level of the reset signal switches after the gate driving circuit scans the $1^{st}$ to $N^{th}$ gate lines sequentially in a frame period, and i is an integer that is greater than or equal to 1 and is smaller than or equal to N.

In one embodiment of the invention, the reset unit resets voltage levels of the first node and the second node after the voltage level of the reset signal switches.

In one embodiment of the invention, the gate driving circuit further includes at least one reset line that is coupled to the reset unit of the $1^{st}$ to $N^{th}$ stage shift registers.

In one embodiment of the invention, the voltage level of the reset signal switches after the gate driving circuit scans the $1^{st}$ to $N^{th}$ gate lines sequentially in the frame period and before the gate driving circuit scans the $1^{st}$ to $N^{th}$ gate lines sequentially in a next frame period.

In one embodiment of the invention, the display panel sequentially displays $1^{st}$ to $K^{th}$ frames after a power-on operation, and the voltage level of the reset signal switches before the $1^{st}$ frame is displayed, where K is an integer that is greater than or equal to 2.

In one embodiment of the invention, the voltage level of the reset signal switches after the display panel switches from a sleep mode to a restart mode.

In one embodiment of the invention, the display panel sequentially displays $1^{st}$ to $M^{th}$ frame after switching from the sleep mode to the restart mode, and the voltage level of the reset signal switches before the $1^{st}$ frame is displayed, where M is an integer that is greater than or equal to 2.

In one embodiment of the invention, the reset unit includes a first transistor and a second transistor. A control terminal of the first transistor is configured to receive the reset signal, a first terminal of the first transistor is coupled to a reference voltage, and a second terminal of the first transistor is coupled to the first node. A control terminal of the second transistor is configured to receive the reset signal, a first terminal of the second transistor is coupled to the reference voltage, and a second terminal of the second transistor is coupled to the second node.

In one embodiment of the invention, the pull-up unit includes a third transistor. A control terminal of the third transistor is coupled to the first node and is configured to receive the pre-charge signal, a first terminal of the third transistor is configured to receive a clock signal, and a second terminal of the third transistor is coupled to the second node and is configured to output the scan signal.

In one embodiment of the invention, the pull-up unit includes a capacitor. A first terminal of the capacitor is coupled to the control terminal of the third transistor, and a second terminal of the capacitor is coupled to the second terminal of the third transistor.

In one embodiment of the invention, the pre-charge unit includes a fourth transistor and a fifth transistor. A control terminal of the fourth transistor is configured to receive a first input signal, a first terminal of the fourth transistor is configured to receive a forward input signal, and a second terminal of the fourth transistor is coupled to the first node. A control terminal of the fifth transistor is configured to receive a second input signal, a first terminal of the fifth transistor is configured to receive a backward input signal, and a second terminal of the fifth transistor is coupled to the second terminal of the fourth transistor.

In one embodiment of the invention, the pre-charge unit includes a fourth transistor. A control terminal of the fourth transistor is configured to receive a first input signal, a first terminal of the fourth transistor is coupled to a voltage source, and a second terminal of the fourth transistor is coupled to the first node.

In one embodiment of the invention, the $i^{th}$ stage shift register further includes a first pull-down unit and a second pull-down unit. The first pull-down unit is coupled to the first node and a second node and is configured to receive a first pull-down control signal and a second pull-down control signal. The second pull-down unit is coupled to the first node and a second node and is configured to receive a first pull-down control signal and a second pull-down control signal. The first pull-down control signal and the second pull-down control signal are phase-inverted from each other in each frame period of the display panel.

Another aspect of the invention is directed to a display panel which has a display area and a non-display area and includes a substrate, gate lines, data lines, $1^{st}$ to $N^{th}$ stage shift registers and at least one reset line. The gate lines and the data lines are disposed on the substrate. The gate lines have $1^{st}$ to $N^{th}$ gate lines, where N is an integer greater than 1. The $1^{st}$ to $N^{th}$ stage shift registers are disposed on the substrate and in the non-display area and are configured to respectively provide $1^{st}$ to $N^{th}$ stage scan signals to the $1^{st}$ to $N^{th}$ gate lines. The at least one reset line is disposed on the substrate and in the non-display area and is coupled to the $1^{st}$ to $N^{th}$ stage shift registers. An $i^{th}$ stage shift register of the $1^{st}$ to $N^{th}$ stage shift registers includes a pre-charge unit, a pull-up unit and a reset unit. The pre-charge unit is coupled to a first node and is configured to output a pre-charge signal to the first node. The pull-up unit is coupled to the first node and a second node and is configured to output an $i^{th}$ stage scan signal of the $1^{st}$ to $N^{th}$ stage scan signals to the second node. The reset unit is coupled to the first node, the second node and the reset line and is configured to provide a reset signal to the reset unit. A voltage level of the reset signal switches after the $1^{st}$ to $N^{th}$ stage shift registers scans the $1^{st}$ to $N^{th}$ gate lines sequentially in a frame period, and i is an integer that is greater than or equal to 1 and is smaller than or equal to N.

In one embodiment of the invention, the $1^{st}$ to $N^{th}$ stage shift registers are a gate driver on array (GOA).

In one embodiment of the invention, the voltage level of the reset signal switches after the first set of $1^{st}$ to $N^{th}$ stage shift registers scans the $1^{st}$ to $N^{th}$ gate lines sequentially in the frame period and before the first set of $1^{st}$ to $N^{th}$ stage shift registers scans the $1^{st}$ to $N^{th}$ gate lines sequentially in a next frame period.

In one embodiment of the invention, the voltage level of the reset signal further switches before the display panel switches from a non-display status to a display status.

In one embodiment of the invention, odd-numbered stage shift registers and even-numbered stage shift registers of the $1^{st}$ to $N^{th}$ stage shift registers are disposed at two opposite sides of the display panel, respectively, and the at least one reset line includes a first reset line and a second reset line. The first reset line and the second reset line are coupled to the odd-numbered stage shift registers and the even-numbered stage shift registers, respectively, and the first reset line and the second reset line are configured to provide the reset signal to the odd-numbered stage shift registers and the even-numbered stage shift registers, respectively.

In one embodiment of the invention, the display panel further includes a second set of $1^{st}$ to $N^{th}$ stage shift registers. The first set of $1^{st}$ to $N^{th}$ stage shift registers and the second set of $1^{st}$ to $N^{th}$ stage shift registers are disposed at two opposite sides of the display panel, and the at least one reset line includes a first reset line and a second reset line that are respectively coupled to and provide the reset signal to the first set of $1^{st}$ to $N^{th}$ stage shift registers and the second set of $1^{st}$ to $N^{th}$ stage shift registers. An $i^{th}$ gate line of the $1^{st}$ to $N^{th}$ gate lines is electrically connected to an $i^{th}$ stage shift register of the first set of $1^{st}$ to $N^{th}$ stage shift registers and an $i^{th}$ stage shift register of the second set of $1^{st}$ to $N^{th}$ stage shift registers.

Another aspect of the invention is directed to a display panel which has a display area and a non-display area and includes a substrate, gate lines, data lines, $1^{st}$ to $N^{th}$ stage shift registers, a first reset line and a second reset line. The gate lines and the data lines are disposed on the substrate. The gate lines have $1^{st}$ to $N^{th}$ gate lines, where N is an integer greater than 1. The $1^{st}$ to $N^{th}$ stage shift registers are disposed on the substrate and in the non-display area and are configured to respectively provide $1^{st}$ to $N^{th}$ stage scan signals to the $1^{st}$ to $N^{th}$ gate lines. Odd-numbered stage shift registers and even-numbered stage shift registers of the $1^{st}$ to $N^{th}$ stage shift registers are disposed at two opposite sides of the display panel, respectively. The odd-numbered stage shift registers and the even-numbered stage shift registers are coupled to odd-numbered gate lines and even-numbered gate lines of the $1^{st}$ to $N^{th}$ gate lines, respectively. The first reset line and the second reset line are disposed on the substrate and in the non-display area and are configured to respectively provide a first reset signal and a second reset signal to the odd-numbered stage shift registers and the even-numbered stage shift registers. An $i^{th}$ stage shift register of the $1^{st}$ to $N^{th}$ stage shift registers includes a pre-charge unit, a pull-up unit and a reset unit. The pre-charge unit is coupled to a first node and is configured to output a pre-charge signal to the first node. The pull-up unit is coupled to the first node and a second node and is configured to output an $i^{th}$ stage scan signal of the $1^{st}$ to $N^{th}$ stage scan signals to the second node. The reset unit is coupled to the first node, the second node and the first reset line or the second reset line. A voltage level of the first reset signal switches after the odd-numbered stage shift registers scan the odd-numbered gate lines sequentially in a frame period, and a voltage level of the second reset signal switches after the even-numbered stage shift registers scan the even-numbered gate lines sequentially in the frame period, and i is an integer that is greater than or equal to 1 and is smaller than or equal to N.

An advantage of the present invention is at least that, with the voltage level reset function of the gate driving circuit and the display panel of the invention, the shift registers can be avoided from being affected by noise interferences to output abnormal scan signals, ensuring that the display panel displays correct images in each frame period.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

It will be understood that, although the terms "first," "second," and "third" may be used herein to describe various elements, components, areas, layers and/or portions, these elements, components, areas, layers and/or portions, should not be limited by these terms. These terms are only used to distinguish elements, components, areas, layers and/or portions.

In the following description, the term "coupled" may be used to indicate that two or more elements are in direct physical or electrical contact with each other, or may also mean that two or more elements may not be in direct contact with each other. "Coupled" may still be used to indicate that two or more elements cooperate or interact with each other.

Figure 1:
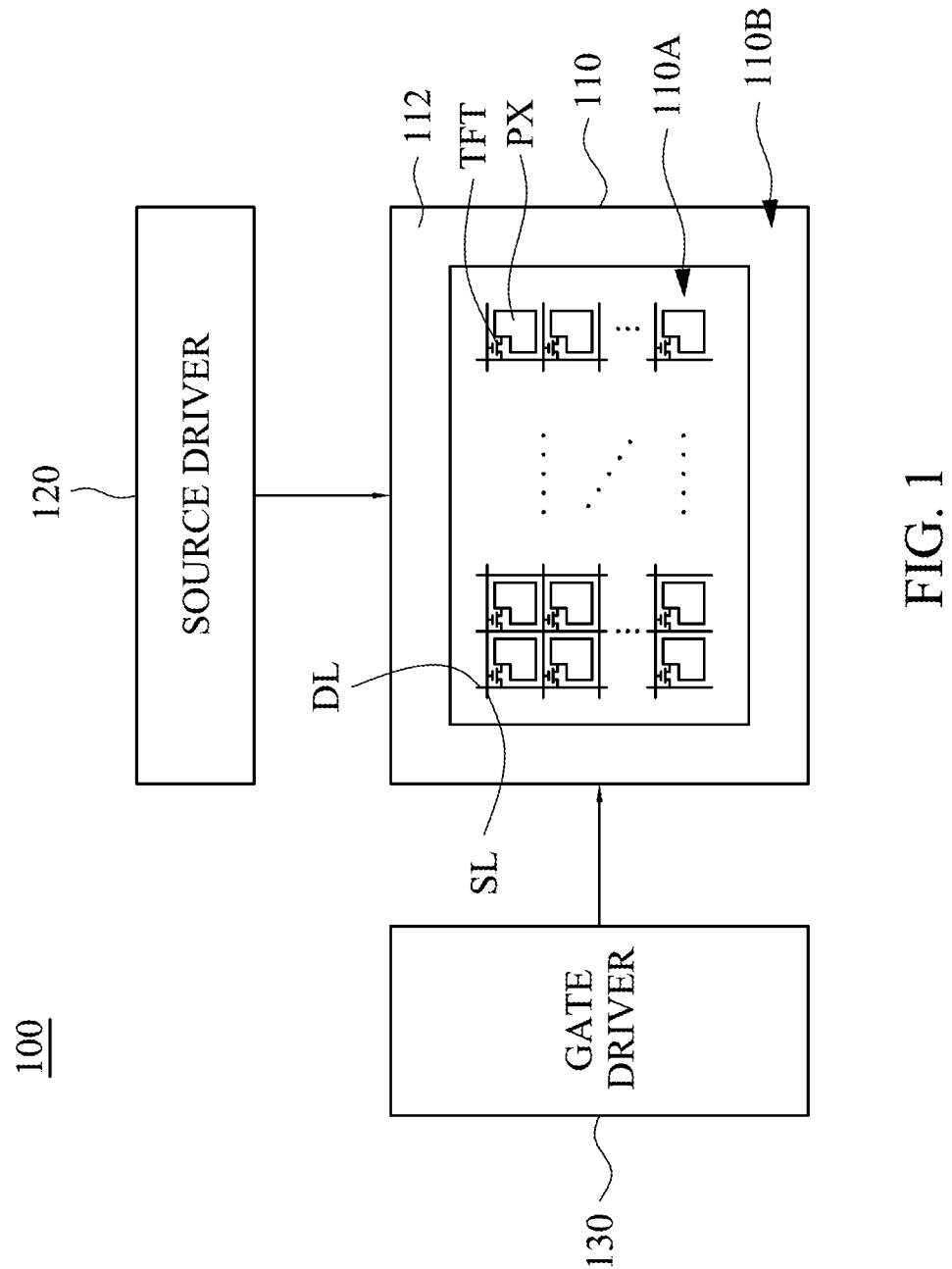
FIG. 1 is a schematic diagram of a display device in accordance with some embodiments of the invention.

Referring to FIG. 1, FIG. 1 is a schematic diagram of a display device 100 in accordance with some embodiments of the invention. The display device 100 includes a display panel 110, a source driver 120 and a gate driver 130. The display panel 110 may be, for example, a liquid crystal display (LCD) apparatus of twisted nematic (TN) mode, in-plane switching (IPS) mode, fringe-field switching (FFS) mode, vertical alignment (VA) mode or other different modes, or an organic light-emitting diode (OLED) panel. The source driver 120 is electrically connected to the display panel 110 and is configured to convert image data into source driving signals and transmit the source driving signals to the display panel 110. The gate driver 130 is configured to generate and transmit gate driving signals to the display panel 110. The display panel 110 has a display region 110A and a non-display region 110B. In the display region 110A, data lines DL, gate lines SL and pixels PX are formed on the substrate 112, and such pixels PX collectively display an image by the driving of the source driving signals and the gate driving signals. In the non-display region 110B, wirings (not shown) are respectively coupled to the source driver 120 and the gate driver 130 and are respectively coupled to the data lines DL and the gate lines SL in the display region 110A, so as to respectively send the source driving signals and the gate driving signals to thin film transistors TFT of the corresponding pixels PX, such that the pixels PX display corresponding gray levels in a particular time under the on-off switch control of the thin film transistors TFT.

Figure 2:
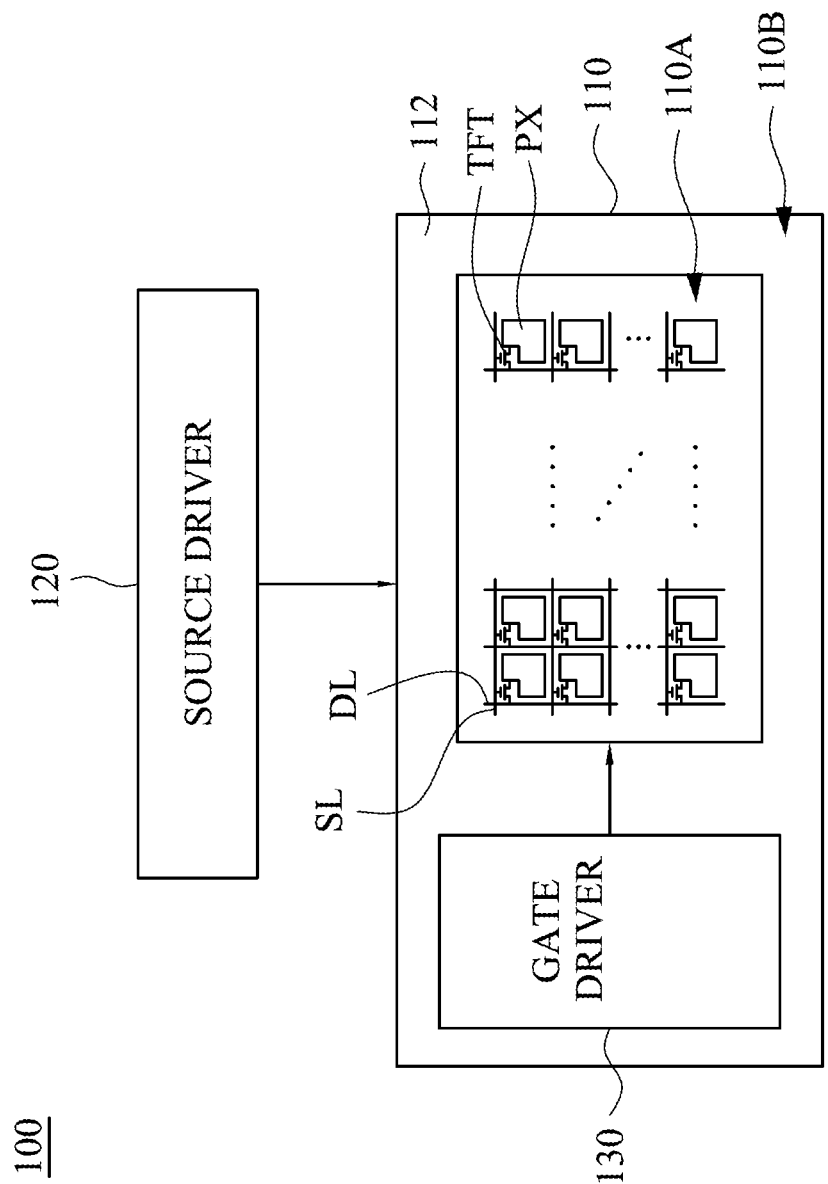
FIG. 2 is a schematic diagram of a display device in accordance with some embodiments of the invention.

The source deriver 120 and/or the gate driver 130 in FIG. 1 may be integrated in the display panel 110. As shown in FIG. 2, the display device 100 of the invention may be a system on glass (SOG) panel, in which the gate driver 130 is formed in the non-display region 110B of the display panel 110. As such, the electrical components in the gate driver 130 and the display region 110A may be formed simultaneously by the same process or processes. For example, the TFTs of the gate driving circuit in the gate driver 130 and the TFTs of the pixels in the display region 110A of the display panel 110 may be formed simultaneously by the same process or processes. In other embodiments, the source driver 120 may also be formed in the non-display region 110B of the display panel 110, and the electrical components and wirings in the display panel 110, the source driver 120 and the gate driver 130 may be formed simultaneously by the same process or processes.

Figure 3:
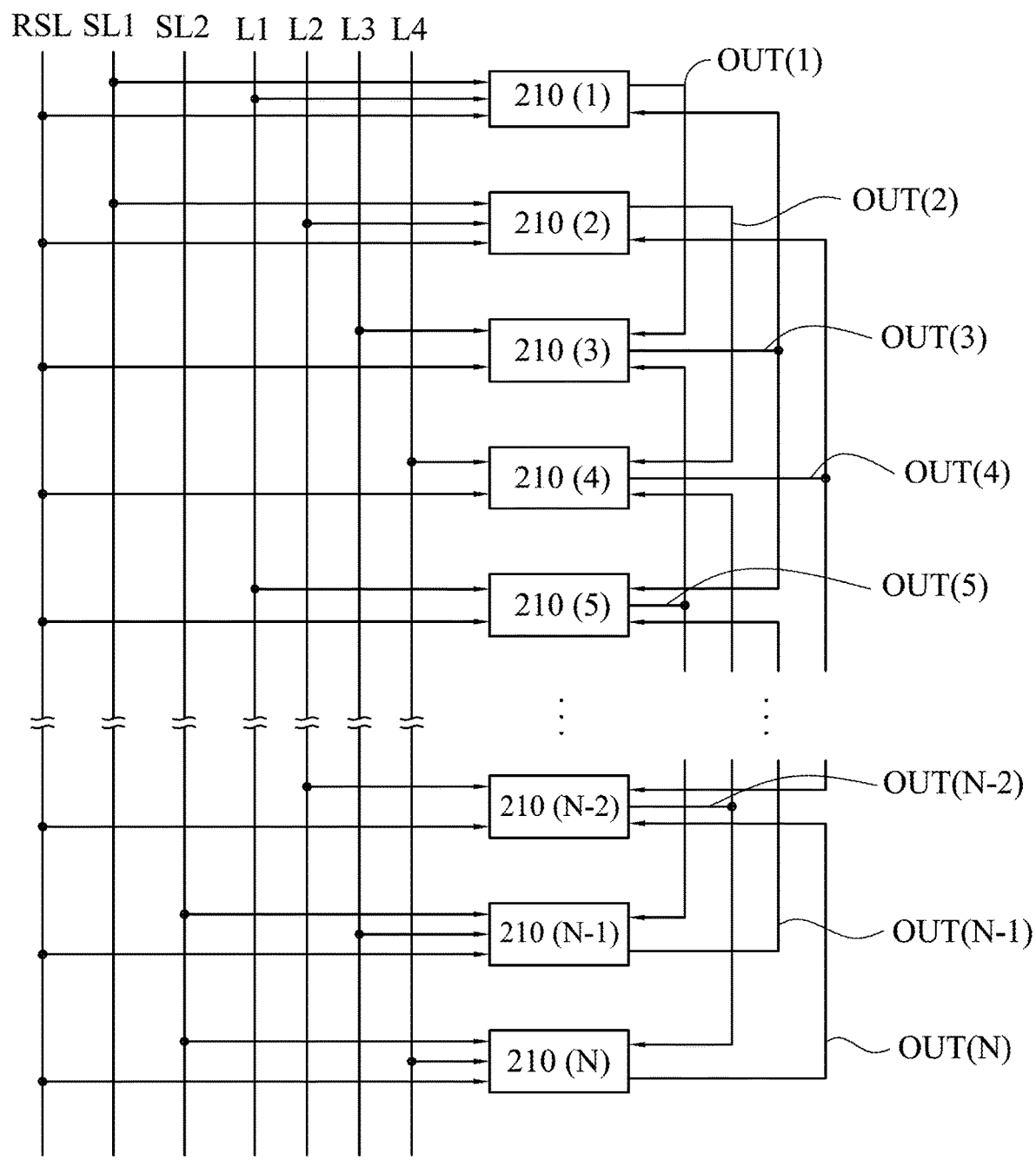
FIG. 3 is a schematic diagram of a gate driving circuit in accordance with some embodiments of the invention.

Referring to FIG. 3, which illustrates a schematic diagram of a gate driving circuit 200 in accordance with some embodiments of the invention. The gate driving circuit 200 may be applied to the display device 100 in FIG. 1 or FIG. 2, or another similar display device. In the following, the gate driving circuit 200 applied to the display device 100 in FIG. 2 is exemplified for description. The gate driving circuit 200 is a part of the gate driver 130, and includes clock signal lines L1-L4, a starting signal line SL1, an ending signal line SL2, a reset signal line RSL and $1^{st}$ to $N^{th}$ stage shift registers 210(1)-210(N), where N is an integer greater than or equal to 5. The clock signal lines L1-L4 respectively provide clock signals C1-C4 to the corresponding shift registers 210(1)-210(N). The $1^{st}$ to $N^{th}$ stage shift registers 210(1)-210(N) are a Gate Driver on Array (GOA) circuit structure. In some embodiments, as shown in FIG. 3, N is a multiple of 4, the clock signal line L1 provides the clock signal C1 to the $1^{st}$ stage shift register 210(1), the $5^{th}$ stage shift register 210(5), . . . , and the $(N-3)^{th}$ stage shift register 210(N−3), the clock signal line L2 provides the clock signal C2 to the $2^{nd}$ stage shift register 210(2), the $6^{th}$ stage shift register 210(6), . . . , and the $(N-2)^{th}$ stage shift register 210(N−2), the clock signal line L3 provides the clock signal C3 to the $3^{rd}$ stage shift register 210(3), the $7^{th}$ stage shift register 210(7), . . . , and the $(N-1)^{th}$ stage shift register 210(N−1), and the clock signal line L4 provides the clock signal C4 to the $4^{th}$ stage shift register 210(4), the $8^{th}$ stage shift register 210(8), . . . , and the $N^{th}$ stage shift register 210(N). In addition, the starting signal line SL1 provides a starting signal STV1 to the $1^{st}$ and $2^{nd}$ stage shift registers 210(1) and 210(2), the ending signal line SL2 provides an ending signal STV2 to the $(N-1)^{th}$ and $N^{th}$ stage shift registers 210(N−1) and 210(N), and the reset signal line RSL provides a reset signal RST to the $1^{st}$ to $N^{th}$ stage shift registers 210(1)-210(N). The clock signal lines L1-L4, the starting signal line SL1, the ending signal line SL2 and the reset signal line RSL may be coupled to one or more chips. That is, the clock signals C1-C4, the starting signal STV1, the ending signal STV2 and the reset signal RST may be provided by the chip(s), such as a timing controller chip or a driving circuit, but are not limited thereto.

The $1^{st}$ to $N^{th}$ stage shift registers 210(1)-210(N) respectively provide $1^{st}$ to $N^{th}$ stage scan signals OUT(1)-OUT(N) to the corresponding gate lines SL. The $1^{st}$ and $2^{nd}$ stage scan signals OUT(1) and OUT(2) are respectively inputted to the $3^{rd}$ and $4^{th}$ stage shift registers 210(3) and 210(4), the $(N-1)^{th}$ and $N^{th}$ scan signals OUT(N−1) and OUT(N) are respectively inputted to the $(N-3)^{th}$ and $(N-2)^{th}$ stage shift registers 210(N-3) and 210(N-2), and each of the $3^{rd}$ to $(N-2)^{th}$ stage scan signals OUT(3)-OUT(N-2) is inputted to the shift registers previous two stage of shift register thereto and next two stage of shift register thereto. For illustration, the $3^{rd}$ stage scan signal OUT(3) is inputted to the $1^{st}$ and $5^{th}$ shift registers 210(1) and 210(5).

Figure 4:
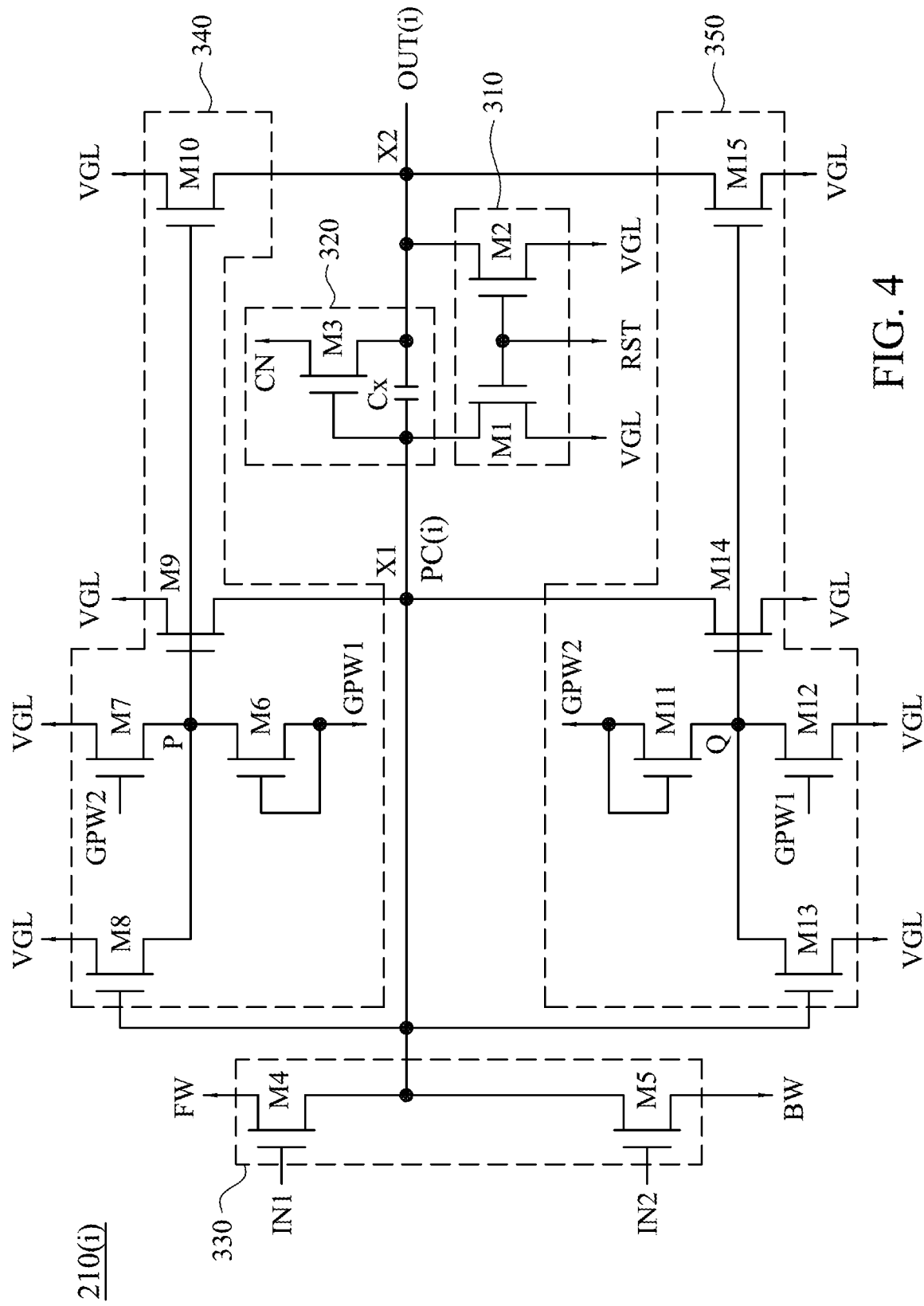
FIG. 4 and FIG. 4A respectively illustrates an equivalent circuit diagram of a shift register in FIG. 3 in accordance with various embodiments.

FIG. 4 illustrates an equivalent circuit diagram in accordance with the $i^{th}$ stage shift register 210($i$) of the gate driving circuit 200 in FIG. 3, where i is an integer from 1 to N. The $i^{th}$ stage shift register 210($i$) includes a reset unit 310, a pull-up unit 320, a pre-charge unit 330, a first pull-down unit 340 and a second pull-down unit 350, in which terminals of the reset unit 310, the pull-up unit 320, the pre-charge unit 330, the first pull-down unit 340 and the second pull-down unit 350 are coupled to the node X1 (which corresponds to the pre-charge signal PC(i)), and the other terminals of the reset unit 310, the pull-up unit 320, the first pull-down unit 340 and the second pull-down unit 350 are coupled to the node X2 (which corresponds to an $i^{th}$ stage scan signal OUT(i) of the $1^{st}$ to $N^{th}$ stage scan signals OUT(1)-OUT(N)), and the node X2 is coupled to a corresponding gate line (not shown).

The reset unit 310 receives the reset signal RST, and resets the voltage levels of the nodes X1 and X2 (i.e. resets the pre-charge signal PC(i) and the scan signal OUT(i)) based on the reset signal RST after scanning all of the gate lines SL of the display panel 110 sequentially in each frame period. That is, after outputting the last stage scan signal (the $N^{th}$ stage scan signal OUT(N) in the embodiments) in each frame period, the voltage levels of the nodes X1 and X2 are set to be low voltage levels. It is noted, in the application, "scanning the gate lines" means having the gate lines sequentially at an enabling voltage level (in the embodiment, the high voltage level) to turn on the TFTs in the rows of pixels respectively corresponding thereto. Moreover, "output an $i^{th}$ stage scan signal OUT(i)" means enabling the $i^{th}$ stage scan signal OUT(i) to have the scan signal OUT(i) at an enabling voltage level (the high voltage level in the enablement), such that the voltage applied to the corresponding gate line is at the enabling voltage level to turn on the TFTs in the row of pixels corresponding thereto. In some embodiments, the reset unit 310 further resets the voltage levels of the nodes X1 and X2 before the display panel 110 switches from a non-display status to a display status. The reset unit 310 includes transistors M1 and M2. The control terminals of the transistors M1 and M2 receive the reset signal RST, the first terminals of the transistors M1 and M2 are coupled to the reference level, and the second terminals of the transistors M1 and M2 are coupled to the nodes X1 and X2, respectively. As shown in FIG. 4, the reference voltage in the embodiments is a gate low voltage (VGL), but is not limited thereto. In the context, the terms "control terminal", "first terminal" and "second terminal" of a transistor are respectively directed to the gate, the source and the drain of the transistor, or are respectively directed to the gate, the drain and the source of the transistor.

The pull-up unit 320 is coupled to the reset unit 310 and is configured to receive the pre-charge signal PC(i) and a clock signal CN to output the scan signal OUT(i) to the node X2 based on the pre-charge signal PC(i) and the clock signal CN, in which the clock signal CN is one of the clock signals C1-C4. In the embodiments in which N is a multiple of 4, if i is 1, 5, . . . or (N-3), the clock signal CN is the clock signal C1; if i is 2, 6, . . . or (N-2), the clock signal CN is the clock signal C2; if i is 3, 7, . . . or (N-1), the clock signal CN is the clock signal C3; if i is 4, 8, . . . or N, the clock signal CN is the clock signal C4. The pull-up unit 320 includes a transistor M3 and a capacitor Cx. The control terminal of the transistor M3 receives the pre-charge signal PC(i), the first terminal of the transistor M3 receives the clock signal CN, and the second terminal of the transistor M3 outputs the scan signal OUT(i). The two terminals of the capacitor Cx are respectively coupled to the control terminal and the second terminal of the transistor M3. It is noted that, in various embodiments, the pull-up unit 320 may not include the capacitor Cx, i.e., no capacitor Cx is disposed between the control terminal and the second terminal of the transistor M3.

Figure 4A:
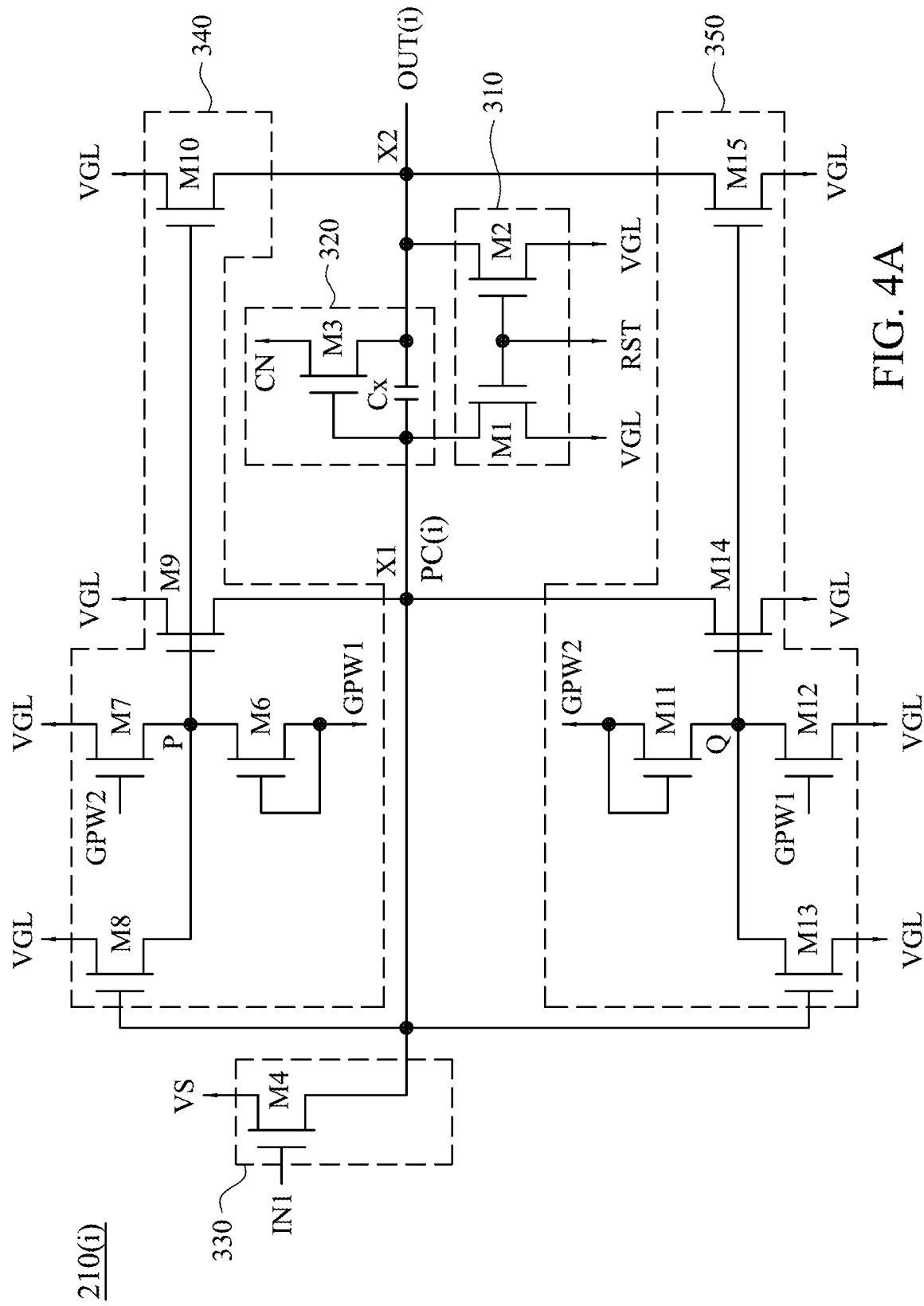

The pre-charge unit 330 is coupled to the reset unit 310 and the pull-up unit 320, and receives input signals IN1 and IN2 to output the pre-charge signal PC(i) to the node X1 based on the input signals IN1 and IN2. The pre-charge unit 330 includes transistors M4 and M5. In the embodiments, the gate driving circuit 200 is a driving circuit of bidirectional scanning; in each of the shift registers 210(1)-210(N), the control terminals of the transistors M4 and M5 respectively receive the input signals IN1 and IN2, the first terminal of the transistors M4 and M5 respectively receive a forward input signal FW and a backward input signal BW, and the second terminals of the transistor M4 and M5 are coupled to the node X1. It is noted that, in a variant embodiment, as shown in FIG. 4A, the pre-charge unit 330 may only include the transistor M4 and may not include the transistor M5. In such case, the control terminal of the transistor M4 receives the input signal IN1, the first terminal of the transistor M4 is electrically connected to a fixed voltage source VS, and the second terminal of the transistor M4 is coupled to the node X1. The transistor M4 outputs the pre-charge signal PC(i) to the node X1 based on the input signal IN1.

If the shift register 210($i$) is the $1^{st}$ stage shift register 210(1) or the $2^{nd}$ stage shift register 210(2) (i.e. i is 1 or 2), the input signal IN1 is the starting signal STV1, and the input signal IN2 is the scan signal OUT(i+2) outputted by the $(i+2)^{th}$ stage shift register 210(i+2) (i.e. the $3^{rd}$ stage scan signal OUT(3) or the $4^{th}$ stage scan signal OUT(4)). If the shift register 210($i$) is any one of the $3^{rd}$ stage shift register 210(3) to the $(N-2)^{th}$ stage shift register 210(N-2) (i.e. i is any integer from 3 to N-2), the input signals IN1 and IN2 are respectively the scan signal OUT(i-2) outputted by the $(i-2)^{th}$ stage shift register 210(i-2) and the scan signal OUT(i+2) outputted by the $(i+2)^{th}$ stage shift register 210(i+2). If the shift register 210($i$) is the $(N-1)^{th}$ stage shift register 210(N-1) or the $N^{th}$ stage shift register 210(N) (i.e. i is N-1 or N), the input signal IN1 is the scan signal OUT(i-2) outputted by the $(i-2)^{th}$ stage shift register 210(i-2), and the input signal IN2 is the ending signal STV2.

It is noted that, when the gate driving circuit 200 is operated in a forward scanning mode, i.e. the forward input signal FW is at the high voltage level and the backward input signal BW is at the low voltage level, STV1 is a starting signal, while STV2 is an ending signal; when the gate driving circuit 200 is operated in a backward scanning mode, i.e., the forward input signal FW is at the low voltage level and the backward input signal BW is at the high voltage level, STV2 is a starting signal, while STV1 is an ending signal. In the embodiments of this application, the forward scanning mode is exemplified, i.e. STV1 is a starting signal while STV2 is an ending signal; the embodiments for the backward scanning mode can be analogized from above and will not be repeated herein.

The first pull-down unit 340 is coupled to the reset unit 310, the pull-up unit 320 and the pre-charge unit 330, and receives the pre-charge signal PC(i) and the pull-down control signals GPW1 (also called a first pull-down control signal) and GPW2 (also called a second pull-down control signal) to control whether to pull down the scan signal OUT(i) to the reference voltage level VGL and then keep the scan signal OUT(i) at the reference voltage level VGL based on the pre-charge signal PC(i) and the pull-down control signals GPW1 and GPW2. The first pull-down unit 340 includes transistors M6-M10. The control terminal and the first terminal of the transistor M6 receive the pull-down control signal GPW1. The control terminal of the transistor M7 receives the pull-down control signal GPW2, the first terminal of the transistor M7 is coupled to the reference voltage level VGL, and the second terminal of the transistor M7 is coupled to the second terminal of the transistor M6. The control terminal of the transistor M8 is coupled to the node X1, the first terminal of the transistor M8 is coupled to the reference voltage level VGL, and the second terminal of the transistor M8 is coupled to the second terminals of the transistors M6 and M7. The control terminal of the transistor M9 is coupled to the second terminal of the transistor M8, the first terminal of the transistor M9 receives the reference voltage level VGL, and the second terminal of the transistor M9 is coupled to the node X1. The control terminal of the transistor M10 is coupled to the second terminal of the transistor M8, the first terminal of the transistor M10 receives the reference voltage level VGL, and the second terminal of the transistor M10 is coupled to the node X2. After the shift register 210(i) outputs the scan signal OUT(i) to activate the corresponding column of pixels (i.e. the voltage level of the scan signal OUT(i) rises to the high voltage level and then falls to the low voltage level after keeping at the high voltage level in a period of time), the voltage level of the node X1 falls to the low voltage level from the high voltage level, and the first pull-down unit 340 starts working. When the voltage levels of the pull-down control signals GPW1 and GPW2 are respectively the low voltage level and the high voltage level, the node P is in a low voltage level status, such that the transistors M9 and M10 are turned-off. When the voltage levels of the pull-down control signals GPW1 and GPW2 are respectively the high voltage level and the low voltage level, the node P is in a high voltage level status, such that the transistors M9 and M10 are turned on, so as to set the voltage levels of the nodes X1 and X2 to the reference voltage level VGL.

The second pull-down unit 350 is coupled to the reset unit 310, the pull-up unit 320 and the pre-charge unit 330, and receives the pre-charge signal PC(i) and the pull-down control signals GPW1 and GPW2 to control whether to pull down the scan signal OUT(i) to the reference voltage level VGL and then keep the scan signal OUT(i) at the reference voltage level VGL based on the pre-charge signal PC(i) and the pull-down control signals GPW1 and GPW2. In each frame period, the pull-down control signals GPW1 and GPW2 are phase-inverted from each other, i.e., one and the other of the pull-down control signals GPW1 and GPW2 are an enabling voltage level (in the embodiment, the high voltage level) and a disabling voltage level (in the embodiment, the low voltage level), respectively, so as to enable one of the first pull-down unit 340 and the second pull-down unit 350. The second pull-down unit 350 includes transistors M11-M15. The control terminal and the first terminal of the transistor M11 receive the pull-down control signal GPW2. The control terminal of the transistor M12 receives the pull-down control signal GPW1, the first terminal of the transistor M12 is coupled to the reference voltage level VGL, and the second terminal of the transistor M12 is coupled to the second terminal of the transistor M11. The control terminal of the transistor M13 is coupled to the node X1, the first terminal of the transistor M13 is coupled to the reference voltage level VGL, and the second terminal of the transistor M13 is coupled to the second terminals of the transistors M11 and M12. The control terminal of the transistor M14 is coupled to the second terminal of the transistor M13, the first terminal of the transistor M14 receives the reference voltage level VGL, and the second terminal of the transistor M14 is coupled to the node X1. The control terminal of the transistor M15 is coupled to the second terminal of the transistor M13, the first terminal of the transistor M15 receives the reference voltage level VGL, and the second terminal of the transistor M15 is coupled to the node X2. After the shift register 210(i) outputs the scan signal OUT(i) to activate the corresponding column of pixels (i.e. the voltage level of the scan signal OUT(i) rises to the high voltage level and then falls to the low voltage level after keeping at the high voltage level in a period of time), the voltage level of the node X1 falls to the low voltage level from the high voltage level, and the second pull-down unit 350 starts working. When the voltage levels of the pull-down control signals GPW1 and GPW2 are respectively the low voltage level and the high voltage level, the node Q is in a high voltage level status, such that the transistors M14 and M15 are turned on, so as to set the voltage levels of the nodes X1 and X2 to the reference voltage level VGL. When the voltage levels of the pull-down control signals GPW1 and GPW2 are respectively the high voltage level and the low voltage level, the node Q is in a low voltage level status, such that the transistors M14 and M15 are turned off.

In FIG. 4, the transistors M1-M15 may be amorphous silicon TFTs, low temperature polysilicon (LTPS) TFTs, indium gallium zinc oxide (IGZO) TFTs, or other suitable TFTs.

Figure 5:
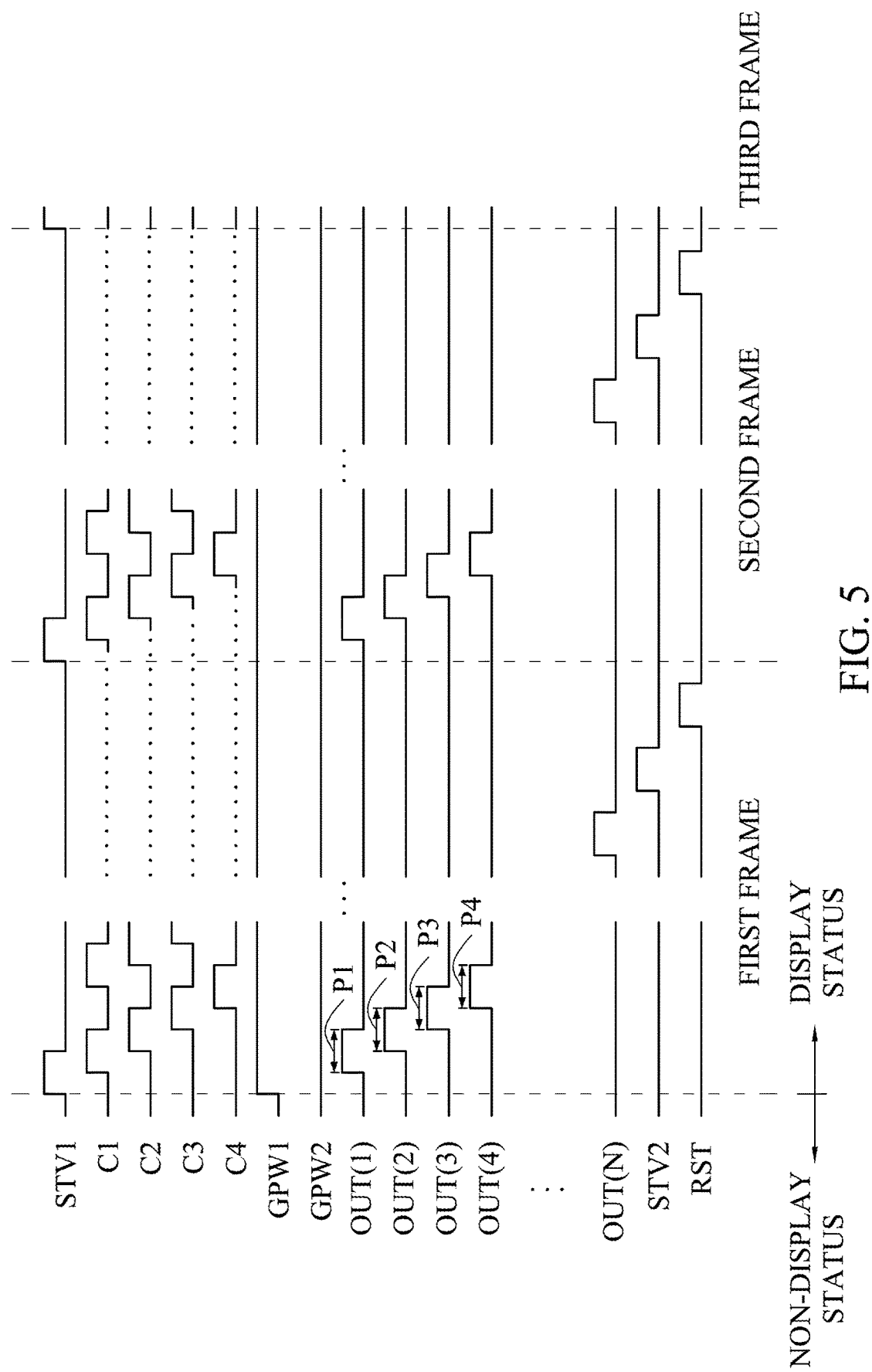
FIG. 5 is an exemplary time sequential diagram in accordance with the gate driving circuit in FIG. 3.

FIG. 5 is an exemplary time sequential diagram in accordance with the gate driving circuit 200 in FIG. 3. As shown in FIG. 5, after the display panel switches form the non-display status to the display status, the gate driving circuit 200 starts outputting the $1^{st}$ to $N^{th}$ stage scan signals OUT(1)-OUT(N). During the first frame period, the starting signal STV1 and the pull-down control signal GPW1 rise from a low voltage level to a high voltage level, and then the clock signals C1-C4 sequentially rise to the high voltage level, such that the $1^{st}$ to $4^{th}$ stage scan signals OUT(1)-OUT(4) correspondingly rise to the high voltage level; the clock signals C1-C4 sequentially falls to the low voltage level, such that the $1^{st}$ to $4^{th}$ stage scan signals OUT(1)-OUT(4) correspondingly fall to the low voltage level. As shown in FIG. 5, the $1^{st}$ to $4^{th}$ stage scan signals OUT(1)-OUT(4) are at the high voltage level respectively in the time periods P1-P4 (i.e. in an enabling status respectively in the time periods P1-P4), so as to turn on the TFTs in corresponding rows of pixels. The high-low voltage level transition period of the clock signals C1-C4 is defined as a clock period. For example, when the clock period of the clock signals C1-C4 is T, in a clock period T, the time durations of the high voltage level and the low voltage level are both T/2, and the clock signals C2, C3 and C4 respectively lag the clock signals C1, C2 and C3 by ¼ clock period (i.e. T/4). The $5^{th}$ to $N^{th}$ stage scan signals OUT(5)-OUT(N) sequentially rise to the high voltage level and sequentially fall to the low voltage level in a same manner based on the above-mentioned description, so as to respectively drive the corresponding pixels in the display panel. It is noted that, although the high voltage levels of any adjacent two stages scan signals overlap in the horizontal axis in the embodiment of FIG. 5 (i.e. the time period P1 of the $1^{st}$ stage scan signal OUT(1) overlaps with the time period P2 of the $2^{nd}$ stage scan signal OUT(2), the time period P2 of the $2^{nd}$ stage scan signal OUT(2) overlaps with the time period P3 of the $3^{rd}$ stage scan signal OUT(3)), but the invention is not limited thereto. In various embodiments, the time periods of the high voltage levels of any adjacent two stages scan signals may not overlap. Before the starting signal STV1 rises from a low voltage level to a high voltage level in the second frame period, the reset signal RST rises from the low voltage level to the high voltage level, i.e., the reset signal RST switches from an disabling voltage level to an enabling voltage level, so as to turn on the transistors M1 and M2 in the shift registers 210(1)-210(N) and further reset the nodes X1 and X2 of the shift registers 210(1)-210(N) to the low voltage level (e.g. the reference voltage level). After completing voltage level reset of the nodes X1 and X2, the reset signal RST falls from the high voltage level to the low voltage level, i.e., the reset signal RST switches from the enabling voltage level to the disabling voltage level to turn off the transistors M1 and M2 of the shift registers 210(1)-210(N), and then the starting signal STV1 rises from a low voltage level to a high voltage level in the second frame period. In other words, after the gate driving circuit scans sequentially the gate lines in the first frame period and before the gate driving circuit performs gate lines scanning in the second frame period, whether the voltage levels of the nodes X1 and X2 in any stage of the shift registers 210(1)-210(N) keep at the predetermined low voltage level or have a ripple under a noise coupling effect, in the invention, the transistors M1 and M2 of the reset unit 310 are turned on through the voltage level switching (e.g. from the low voltage level to the high voltage level) of the reset signal RST, and the voltage levels of the nodes X1 and X2 of the shift registers 210(1)-210(N) are further set to the predetermined disabling voltage level (e.g. the low voltage level), so as to avoid affecting image display. Therefore, the voltage levels of the nodes X1 and X2 before a reset operation may be equivalent to those after the reset operation (e.g. the voltages of the nodes X1 and X2 are not interfered by noise), or the voltage levels of the nodes X1 and X2 before a reset operation may be non-equivalent to those after the reset operation. For example, the voltage level of the node X1 and/or the node X2 is affected by noise coupling, and the transistors M1 and M2 of the reset unit 310 are turned on through the voltage level switching of the reset signal RST, so as to set the voltage levels of the nodes X1 and X2 to be the predetermined low voltage level. In other words, "resetting of the voltage levels of the nodes X1 and X2" means enabling the reset unit 310, i.e., turning on the transistors M1 and M2 of the reset unit 310 to set the voltage levels of the nodes X1 and X2 of the shift registers 210(1)-210(N) to the predetermined disabling voltage level, regardless of whether the voltage levels of the nodes X1 and X2 before enabling the reset unit 310 are the same as those after enabling the reset unit 310. In the embodiments, the reference voltage levels respectively coupled to the reset unit 310, the first pull-down unit 340 and the second pull-down unit 350 are the same and are VGL, but are not limited thereto. In various embodiments, the reference voltage coupled to the reset unit 310 and the reference voltage coupled to the first pull-down unit 340 and the second pull-down unit 350 are different, such that the voltage levels of the nodes X1 and X2 before a reset operation may be different from those of the nodes X1 and X2 after the reset operation. The time sequences of the starting signal STV1, the clock signals C1-C4, and the ending signal STV2 and the $1^{st}$ to $N^{th}$ stage scan signals OUT(1)-OUT(N) in the second frame period and subsequent frame periods are also the same as those in the first frame period, and in each frame period, after the ending signal STV2 rises from the low voltage level to the high voltage level and then falls from the high voltage level to the low voltage level, the reset signal RST is enabled, i.e., the reset signal RST switches from a disabling voltage level (e.g. the low voltage level) to an enabling voltage level (e.g. the high voltage level), so as to reset the voltage levels of the nodes X1 and X2 of the shift registers 210(1)-210(N). Based on the signal time sequential diagram in FIG. 5, the shift registers can be avoided from being affected by noise interferences to output abnormal scan signals, ensuring that the display panel can display correct images in each frame period.

Figure 6:
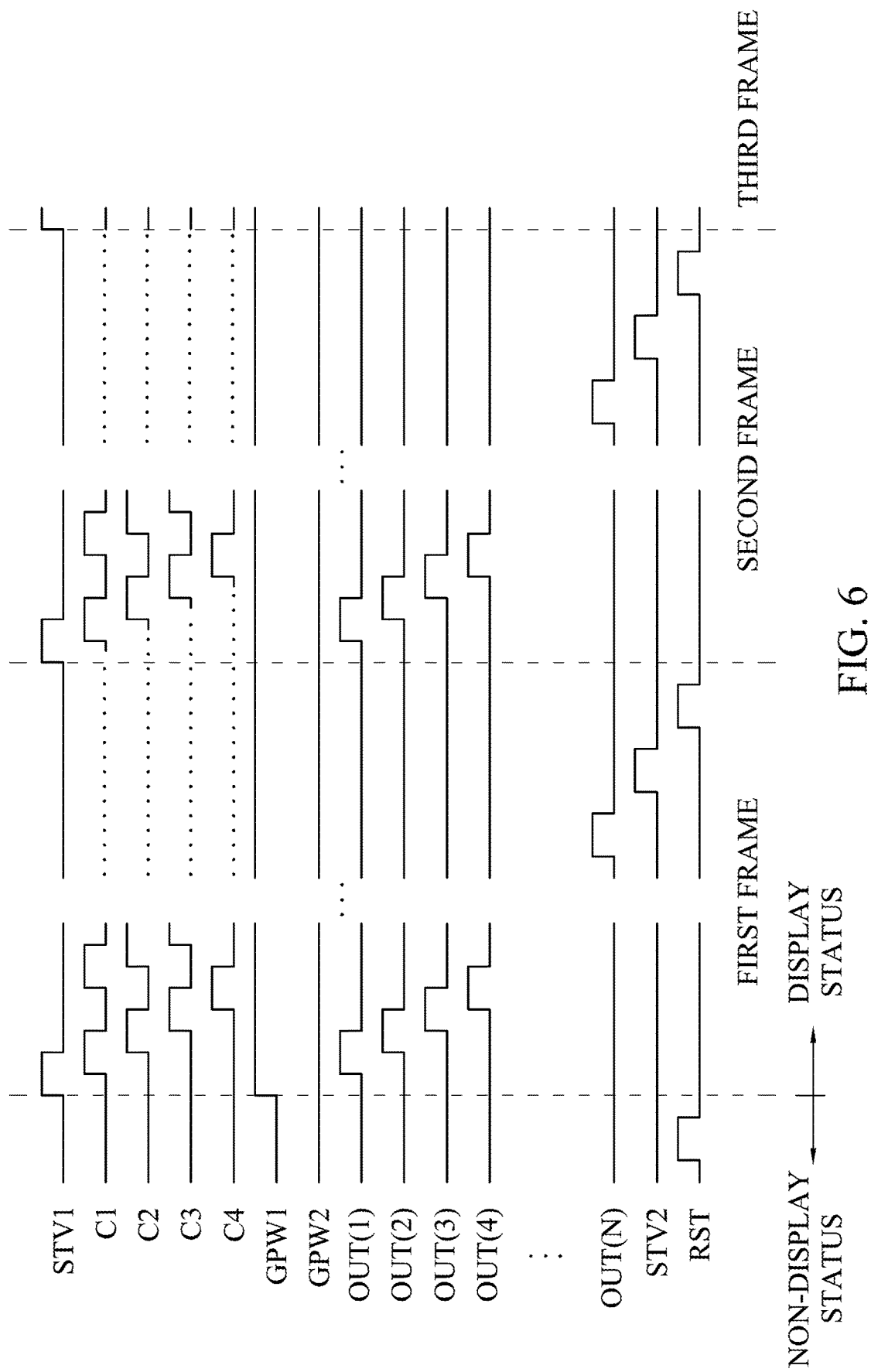
FIG. 6 is another exemplary time sequential diagram in accordance with the gate driving circuit in FIG. 3.

FIG. 6 is another exemplary time sequential diagram in accordance with the gate driving circuit 200 in FIG. 3. The time sequential diagram shown in FIG. 6 is similar to that shown in FIG. 5; the difference between the time sequential diagrams in FIG. 5 and FIG. 6 is that, in FIG. 6, before the display panel switches from the non-display status to the display status, the reset signal RST rises from the low voltage level to the high voltage level first, such that the reset units 310 of the shift registers 210(1)-210(N) reset the voltage level of the nodes X1 and X2 based on the reset signal RST; after resetting the voltage levels of the nodes X1 and X2, the reset signal RST falls from the high voltage level to the low voltage level, and then the display panel switches to the display status and enters the first frame period. In other words, before the starting signal STV1 rises from the low voltage level to the high voltage level in the first frame period, the voltage level change sequence of the reset signal RST is "low-high-low", i.e., the reset signal RST is enabled first to reset the voltage levels of the nodes X1 and X2. As such, the shift registers can be further prevented from being interfered by noise or being affected by abnormal input signals to output abnormal scan signals before the display panel switches form the non-display status to the display status, ensuring that the display panel does not display an abnormal image when switching from the non-display status to the display status.

It is noted that, in the embodiments of FIG. 5 and FIG. 6, after the $N^{th}$ stage scan signal OUT(N) is outputted and the ending signal STV2 rises from a disabling voltage level (i.e. the low voltage level) to an enabling voltage level (i.e. the high voltage level) and falls from the high voltage level to the low voltage level, the reset signal RST rises from the low voltage level to the high voltage level, so as to reset the voltage levels of the nodes X1 and X2 of the shift registers 210(1)-210(N), but the invention is not limited thereto. In various embodiments, the reset signal RST may rise from the low voltage level to the high voltage level after the last stage scan signal is outputted in a frame period, i.e., after the $N^{th}$ stage scan signal OUT(N) rises from the low voltage level to the high voltage level and falls from the high voltage level to the low voltage level, so as to reset the voltage levels of the nodes X1 and X2 of the shift registers 210(1)-210(N).

In the embodiments of FIG. 5 and FIG. 6, after entering the first frame period, the pull-down control signal GPW1 is at the high voltage level, while the pull-down control signal GPW2 is at the low voltage level, but the invention is not limited thereto. In other embodiments, after entering the first frame period, the pull-down control signal GPW1 is at the low voltage level, while the pull-down control signal GPW2 is at the high voltage level. It is noted that the pull-down control signals GPW1 and GPW2 are periodic signals. Each period of the pull-down control signals GPW1 and GPW2 has an enabling voltage level (e.g. the high voltage level) duration and a disabling voltage level (e.g. the low voltage level) duration, and the pull-down control signals GPW1 and GPW2 are alternately enabled, i.e., one of the pull-down control signals GPW1 and GPW2 is at the enabling voltage level while at the same time the other one of the pull-down control signals GPW1 and GPW2 is at the disabling voltage level, so as to enable one of the first pull-down unit 340 and the second pull-down unit 350. Taking a display panel with a frame speed of 60 frames per second (FPS) as an example, the period of the pull-down control signals GPW1 and GPW2 may be 2 seconds, in which the enabling voltage level duration and the disabling voltage level duration are both 1 second, i.e., 60 frame periods. The voltage level switching of the pull-down control signals GPW1 and GPW2 in the display status is omitted in FIG. 5 and FIG. 6.

In addition, in the embodiments of FIG. 5 and FIG. 6, the high voltage level and the low voltage level for each signal are a relatively high voltage value and a relatively low voltage of the signal; the low voltage levels of different signals may be the same or different, and the high voltage levels of different signals may be the same or different. In the embodiments shown in FIG. 5 and FIG. 6, the low voltage level and the high voltage level of the starting signal STV1, the ending signal STV2, the pull-down control signals GPW1 and GPW2, the $1^{st}$ to $N^{th}$ stage scan signals OUT(1)-OUT(N) and the reset signal RST may be respectively referred to as a disabling voltage level and an enabling voltage level of these signals for respectively turning off and turning on the corresponding transistors. However, the invention is not limited thereto. For a variant embodiment of different type transistors (e.g. P-type TFTs), the low voltage level and the high voltage level of the starting signal STV1, the ending signal STV2, the pull-down control signals GPW1 and GPW2, the $1^{st}$ to $N^{th}$ stage scan signals OUT(1)-OUT(N) and the reset signal RST may be respectively referred to as an enabling voltage level and a disabling voltage level of these signals for respectively turning on and turning off the corresponding transistors. That is, the low voltage level and the high voltage level in FIG. 5 and FIG. 6 are respectively changed to the high voltage level and the low voltage level, so as to obtain a corresponding time sequential diagram of the gate driving circuit in the variant embodiment, which is not repeated herein.

Figure 7:
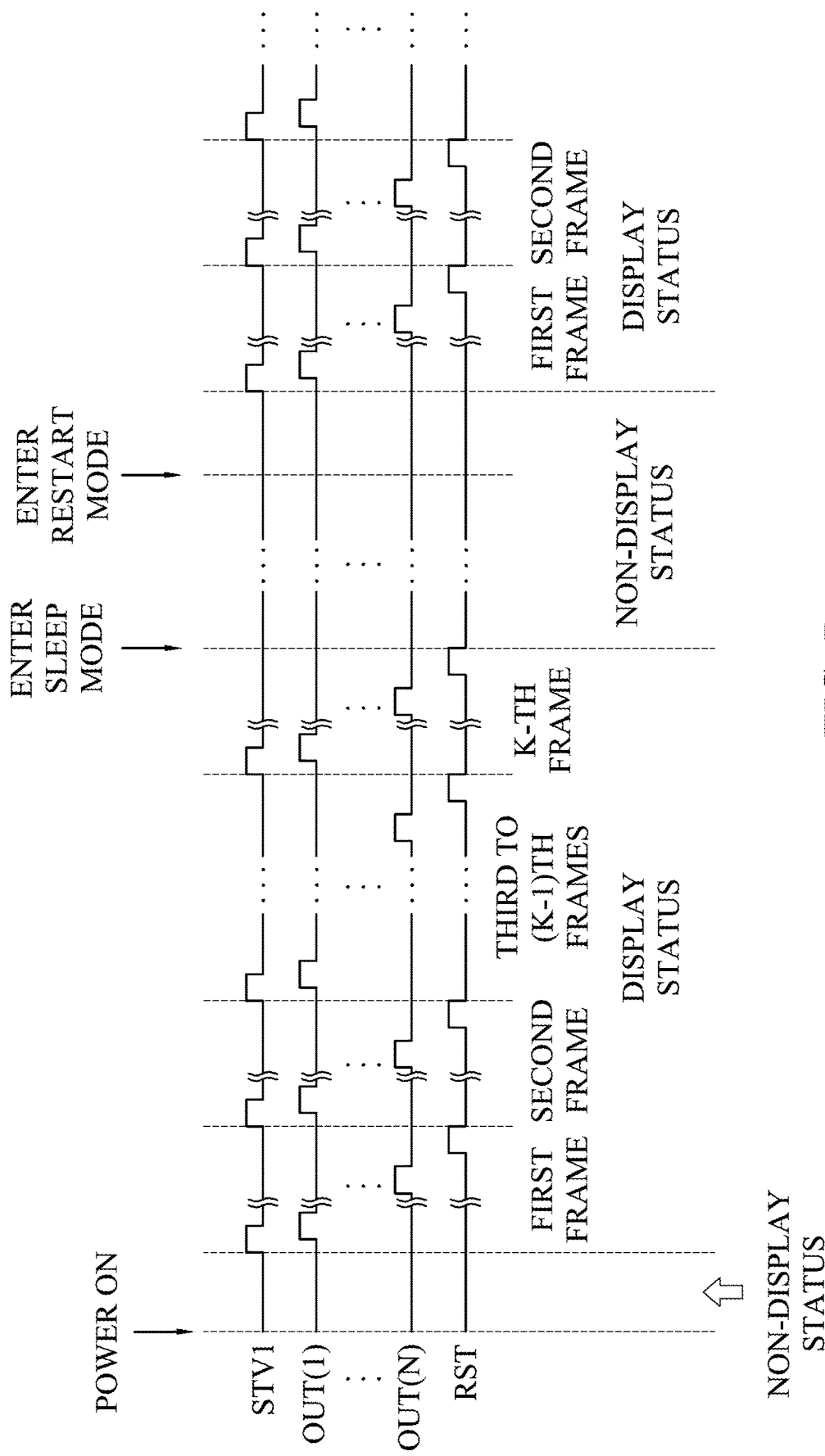
FIG. 7 is an exemplary time sequential diagram of a starting signal and a reset signal in various stages in accordance with the gate driving circuit in FIG. 3.

FIG. 7 exemplarily illustrates a time sequential diagram of the starting signal STV1, the $1^{st}$ to $N^{th}$ stage scan signals OUT(1)-OUT(N) and the reset signal RST in various stages in accordance with the gate driving circuit 200 in FIG. 3. As shown in FIG. 7, after the display panel is powered on and enters the display status, or after the display panel switches from the sleep mode to the restart mode and enters the display status, the starting signal STV1 and the reset signal RST rise to the high voltage level respectively at the start of each frame and after the $1^{st}$ to $N^{th}$ stage scan signals OUT(1)-OUT(N) are sequentially outputted, so as to respectively output the $1^{st}$ to $N^{th}$ stage scan signals OUT(1)-OUT(N) in sequence and reset the voltage levels of the nodes X1 and X2 of each shirt register 210(1)-210(N). After the display device enters a sleep mode and before the display device switches from the sleep mode to the restart mode, the reset signal RST keeps at a disabling voltage level (e.g. the low voltage level).

Figure 8:
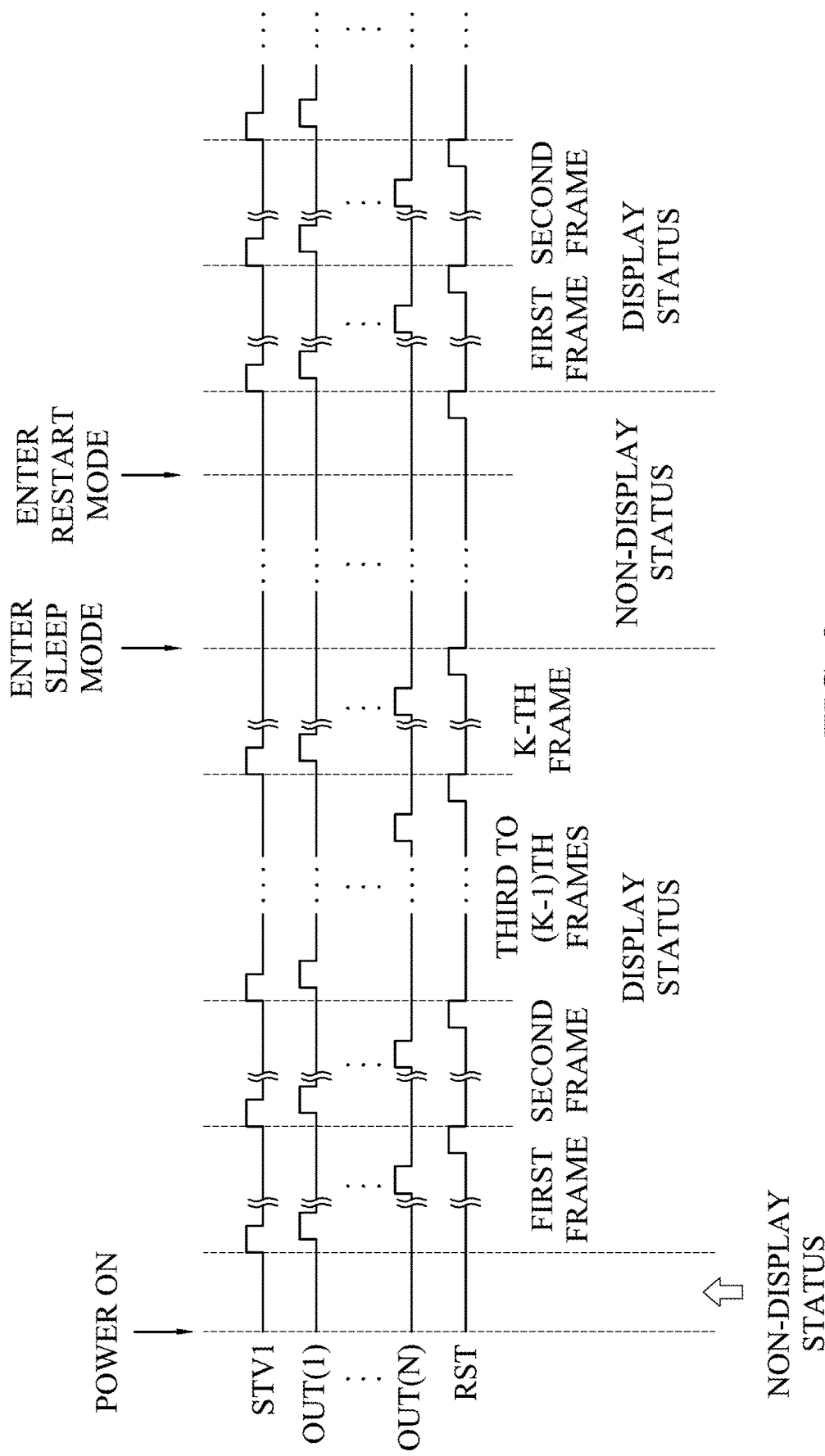
FIG. 8 is another exemplary time sequential diagram of a starting signal and a reset signal in various stages in accordance with the gate driving circuit in FIG. 3.

FIG. 8 exemplarily illustrates another time sequential diagram of the starting signal STV1, the $1^{st}$ to $N^{th}$ stage scan signals OUT(1)-OUT(N) and the reset signal RST in various stages in accordance with the gate driving circuit 200 in FIG. 3. The time sequential diagram shown in FIG. 8 is similar to that shown in FIG. 7; the difference between the time sequential diagrams in FIG. 7 and FIG. 8 is that, in FIG. 8, before the display panel enters the display status after switching from the sleep mode to the restart mode, the reset signal RST rises from the low voltage level to the high voltage level first, such that the reset units 310 of the shift registers 210(1)-210(N) reset the voltage level of the nodes X1 and X2 based on the reset signal RST; after resetting the voltage levels of the nodes X1 and X2, the reset signal RST falls from the high voltage level to the low voltage level, and then the display panel enters the first frame period after a restart operation. In other words, the display panel sequentially displays $1^{st}$ to $M^{th}$ frames after switching from the sleep mode to the restart mode, and the voltage level of the reset signal switches after the display panel switches from a sleep mode to a restart mode and before the $1^{st}$ frame is displayed, (i.e. the voltage level of the reset signal rises to the high voltage level and then falls to the low voltage level after the display panel switches from a sleep mode to a restart mode and before the $1^{st}$ frame is displayed), where M is an integer that is greater than or equal to 2.

Figure 9:
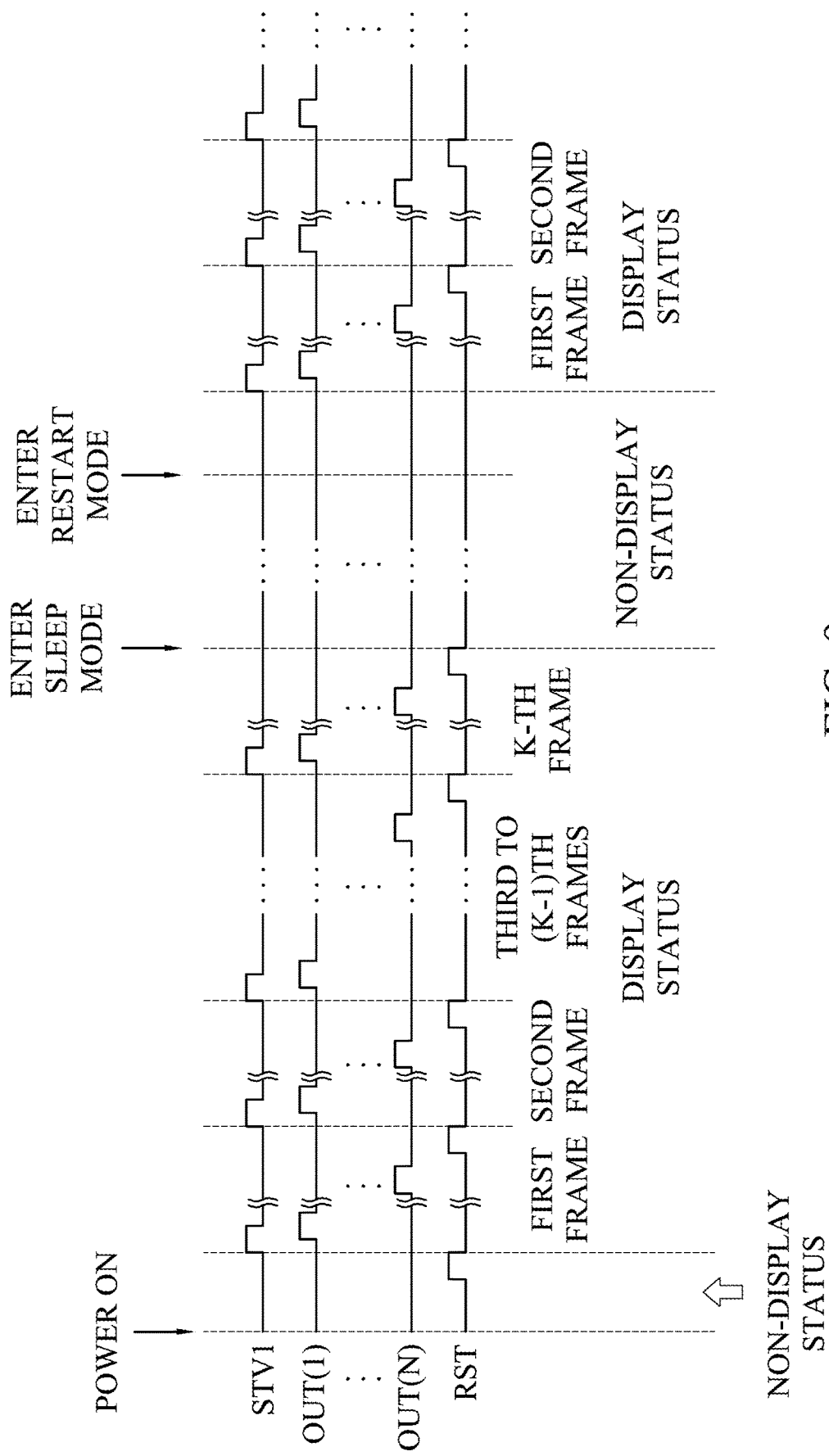
FIG. 9 is yet another exemplary time sequential diagram of a starting signal and a reset signal in various stages in accordance with the gate driving circuit in FIG. 3.

FIG. 9 exemplarily illustrates yet another time sequential diagram of the starting signal STV1, the $1^{st}$ to $N^{th}$ stage scan signals OUT(1)-OUT(N) and the reset signal RST in various stages in accordance with the gate driving circuit 200 in FIG. 3. The time sequential diagram shown in FIG. 9 is similar to that shown in FIG. 7; the difference between the time sequential diagrams in FIG. 7 and FIG. 9 is that, in FIG. 9, before the display panel enters the display status after a power-on operation, the reset signal RST rises from the low voltage level to the high voltage level first, such that the reset units 310 of the shift registers 210(1)-210(N) reset the voltage level of the nodes X1 and X2 based on the reset signal RST; after resetting the voltage levels of the nodes X1 and X2, the reset signal RST falls from the high voltage level to the low voltage level, and then the display panel enters the first frame period after the power-on operation. In other words, the display panel sequentially displays $1^{st}$ to $K^{th}$ frames after a power-on operation, and the voltage level of the reset signal switches before the $1^{st}$ frame is displayed (i.e. the voltage level of the reset signal rises to the high voltage level and then falls to the low voltage level before the $1^{st}$ frame is displayed), where K is an integer that is greater than or equal to 2.

Figure 10:
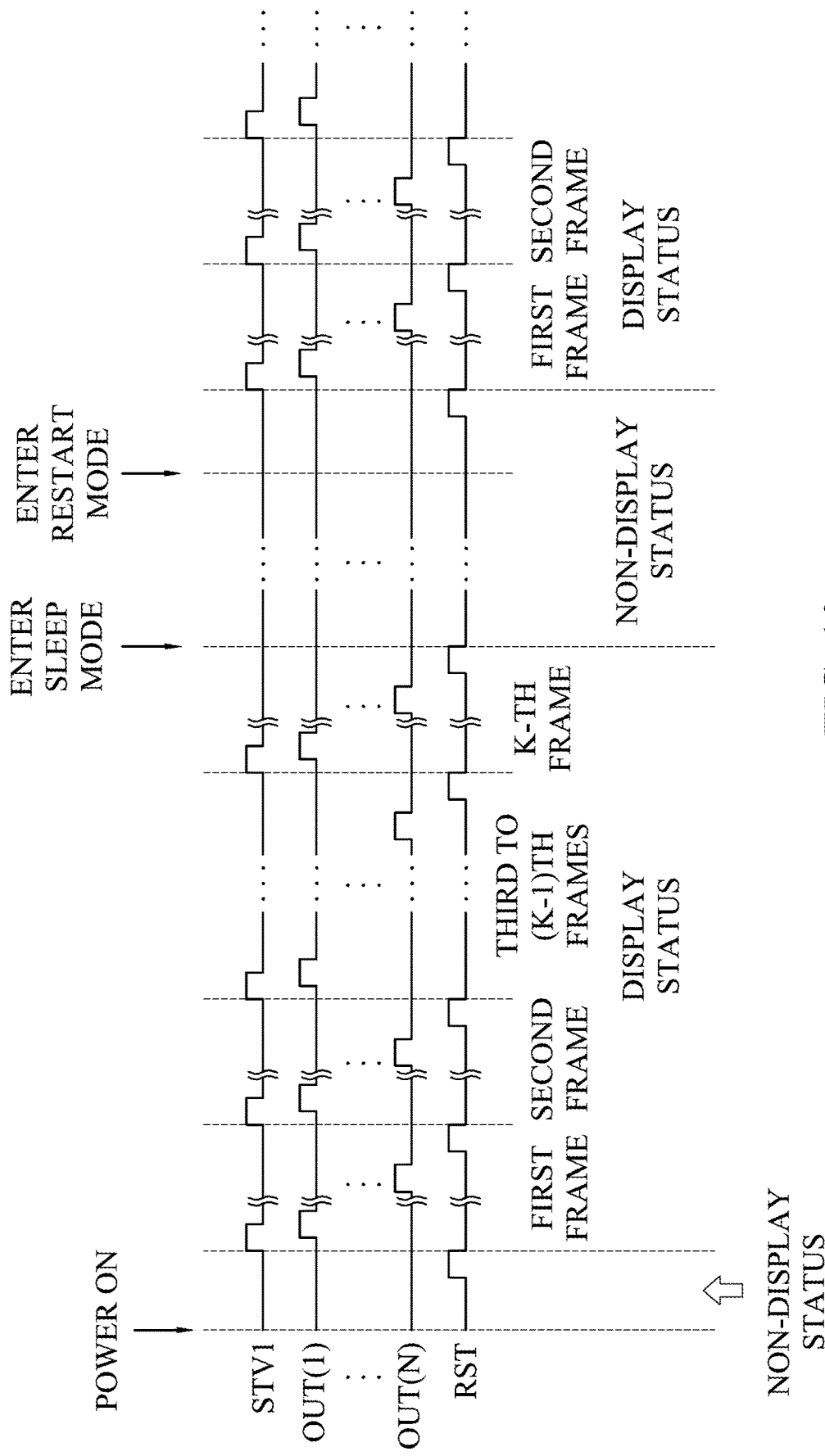
FIG. 10 is yet another exemplary time sequential diagram of a starting signal and a reset signal in various stages in accordance with the gate driving circuit in FIG. 3.

FIG. 10 exemplarily illustrates yet another time sequential diagram of the starting signal STV1, the $1^{st}$ to $N^{th}$ stage scan signals OUT(1)-OUT(N) and the reset signal RST in various stages in accordance with the gate driving circuit 200 in FIG. 3. The time sequential diagram shown in FIG. 10 is similar to that shown in FIG. 9; the difference between the time sequential diagrams in FIG. 9 and FIG. 10 is that, in FIG. 10, before the display panel enters the display status after switching from the sleep mode into the restart mode, the reset signal RST rises from the low voltage level to the high voltage level first, such that the reset units 310 of the shift registers 210(1)-210(N) reset the voltage level of the nodes X1 and X2 based on the reset signal RST; after resetting the voltage levels of the nodes X1 and X2, the reset signal RST falls from the high voltage level to the low voltage level, and then the display panel enters the first frame period after a restart operation.

In addition, although the equivalent circuit diagram illustrated in FIG. 4 includes the first pull-down unit 340 and the second pull-down unit 350, the invention is not limited thereto. In another varied embodiments, the $i^{th}$ stage shift register 210($i$) of the gate driving circuit 200 may only include the reset unit 310, the pull-up unit 320 and the pre-charge unit 330, but does not include the first pull-down unit 340 and the second pull-down unit 350 or includes only one of the first pull-down unit 340 and the second pull-down unit 350. In a further varied embodiment, the number of transistors and the coupling method between the transistors in the reset unit 310, the pull-up unit 320, the pre-charge unit 330, the first pull-down unit 340 and the second pull-down unit 350 may also be different from those shown in FIG. 4.

Figure 11:
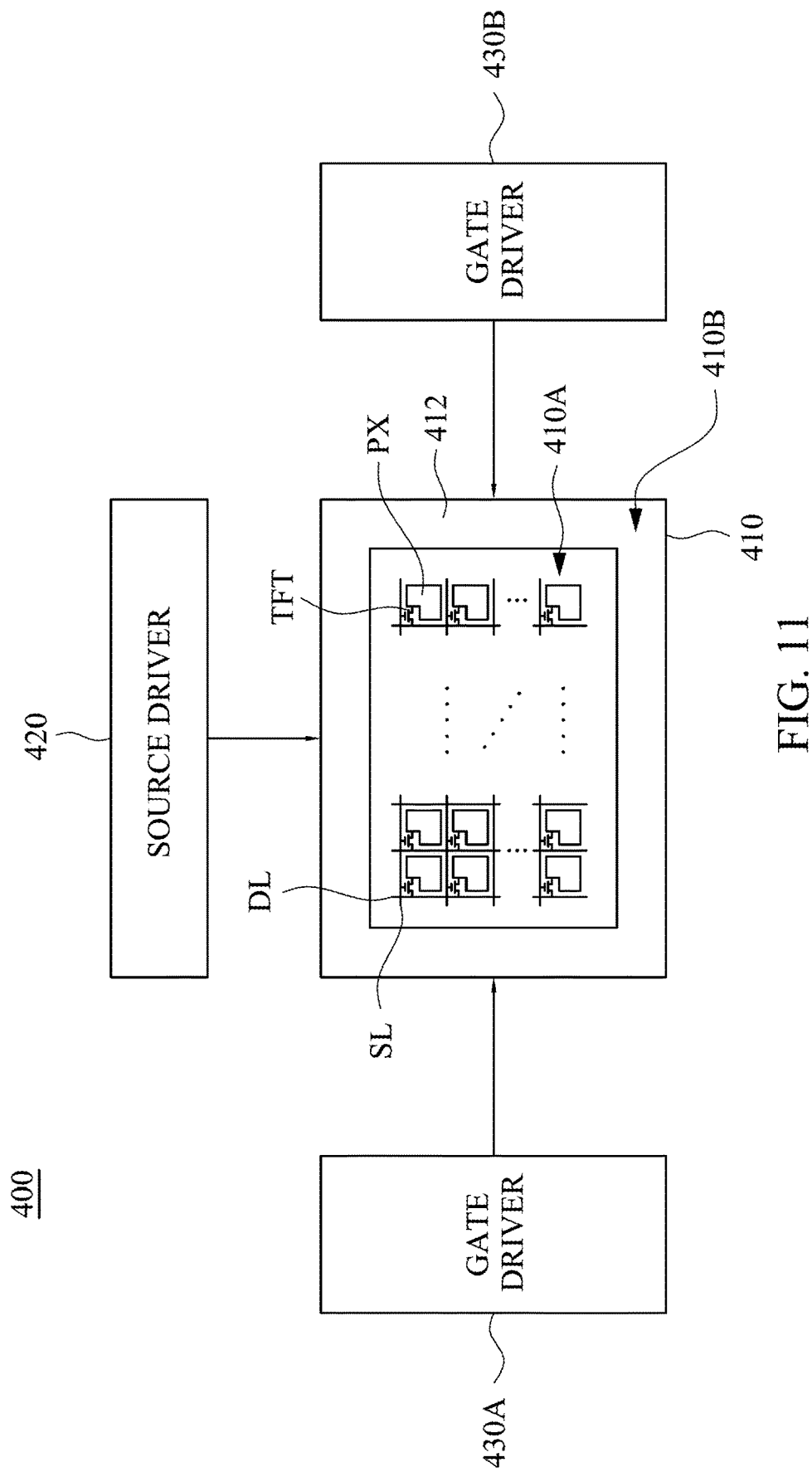
FIG. 11 is a schematic diagram of a display device in accordance with some embodiments of the invention.

Referring to FIG. 11, FIG. 11 is a schematic diagram of a display device 400. The display device 400 includes a display panel 410, a source driver 420 and gate drivers 430A and 430B. The display panel 410 has a display region 410A and a non-display region 410B. In the display region 410A, data lines DL, gate lines SL and pixels PX are formed on the substrate 412, and such pixels PX collectively display an image by the driving of the source driving signals and the gate driving signals. In the non-display region 410B, wirings (not shown) are respectively coupled to the source driver 420 and the gate drivers 430A and 430B, and are respectively coupled to the data lines DL and the gate lines SL in the display region 410A, so as to respectively send the source driving signals and the gate driving signals to thin film transistors TFT of the corresponding pixels PX, such that the pixels PX display corresponding gray levels in a particular time under the on-off switch control of the thin film transistors TFT. The display device 400 is similar to the display device 100 of FIG. 1. The difference between the display device 100 and the display device 400 is that the display device 400 includes two gate drivers 430A and 430B. As shown in FIG. 11, the gate drivers 430A and 430B are disposed at the left and right sides of the display panel 410, respectively, and collectively transmit gate driving signals to the display panel 410. In other embodiments, the disposal of the gate drivers 430A and 430B may be adjusted in accordance with various design requirements. The display panel 410 and the source driver 420 are approximately the same as the display panel 110 and the source driver 120 of FIG. 1, respectively, and the description is not described again herein.

Figure 12:
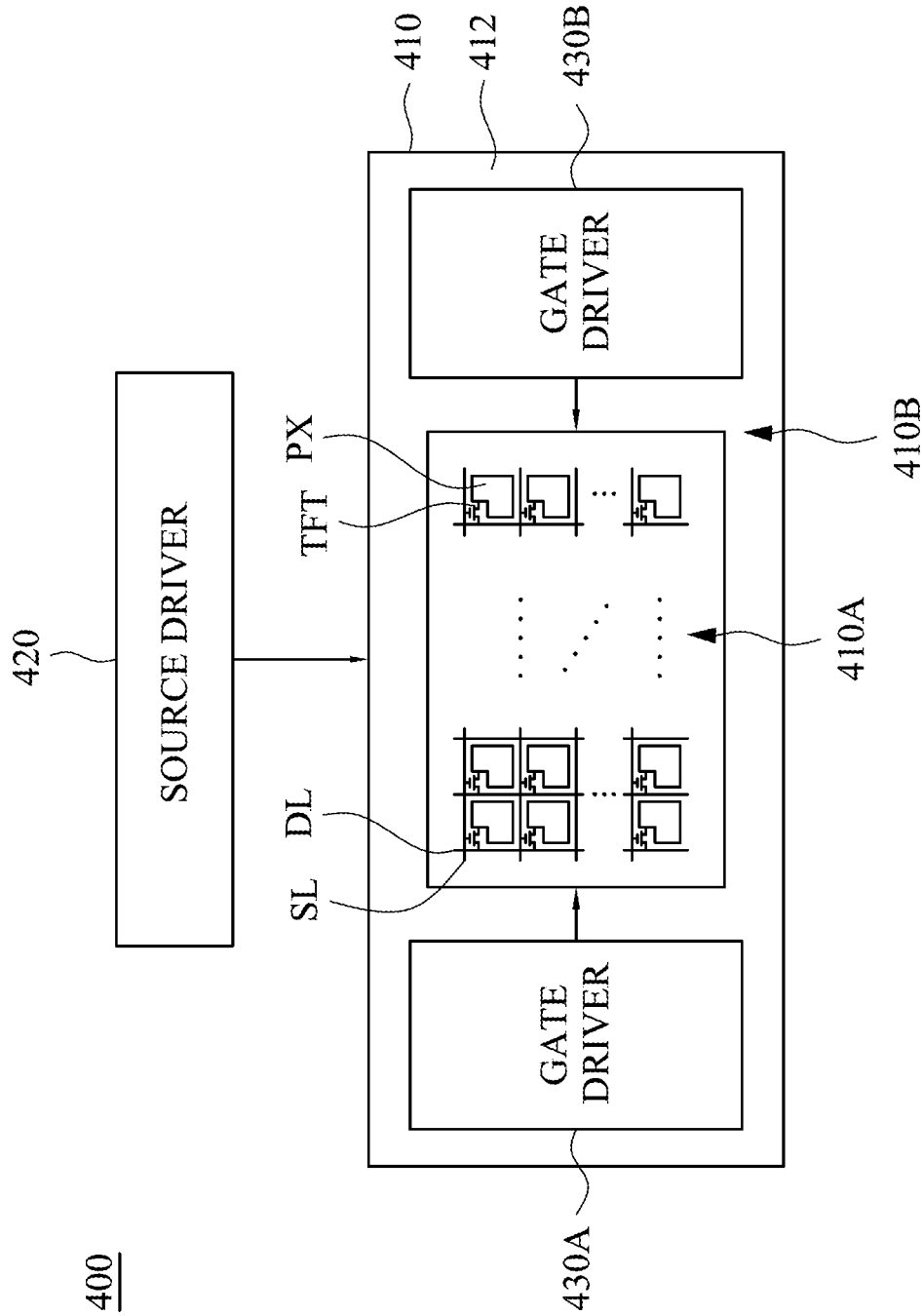
FIG. 12 is a schematic diagram of a display device in accordance with some embodiments of the invention.

Likewise, the source driver 420 and/or the gate drivers 430A and 430B in FIG. 11 may be integrated in the display panel 410. As shown in FIG. 12, the display device 400 of the invention may be an SOG panel, in which the gate drivers 430A and 430B are formed in the non-display region 410B of the display panel 410. As such, the electrical components in the gate drivers 430 and 430B and the display region 410A may be formed simultaneously by the same process or processes. For example, the TFTs of the gate driving circuit in the gate drivers 430A and 430B and the TFTs of the pixels in the display region 410A of the display panel 410 may be formed simultaneously by the same process or processes. In other embodiments, the source driver 420 may also be formed in the non-display region 410B of the display panel 410, and the electrical components and wirings in the display panel 410, the source driver 420 and the gate drivers 430A and 430B may be formed simultaneously by the same process or processes.

Figure 13:
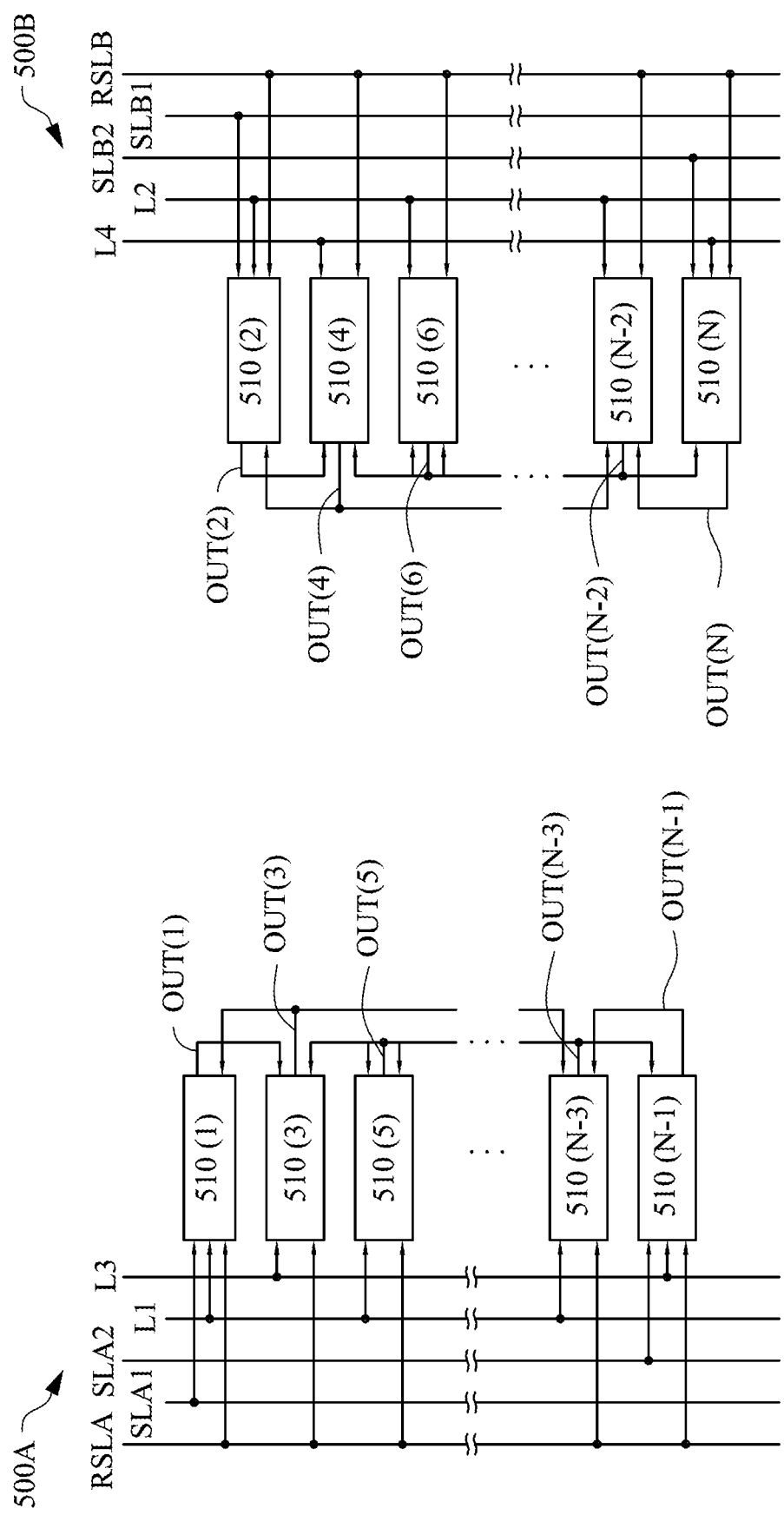
FIG. 13 is a schematic diagram of a gate driving circuit in accordance with some embodiments of the invention.

Referring to FIG. 13, which illustrates a schematic diagram of gate driving circuits 500A and 500B in accordance with some embodiments of the invention. The gate driving circuits 500A and 500B may be applied to the display device 400 in FIG. 11 or FIG. 12, or another similar display device. In the following, the gate driving circuits 500A and 500B applied to the display device 400 in FIG. 12 are exemplified for description. The gate driving circuits 500A and 500B are parts of the gate drivers 430A and 430B, respectively. The gate driving circuits 500A and 500B collectively include $1^{st}$ to $N^{th}$ stage shift registers 510(1)-510(N), where N is an integer greater than or equal to 5. The $1^{st}$ to $N^{th}$ stage shift registers 510(1)-510(N) are a GOA circuit structure. The equivalent circuits of the shift registers 510(1)-510(N) are the same as the equivalent circuit of the shift register 210(i) in FIG. 4. The gate driving circuit 500A includes the odd-numbered stage shift registers 510(1), 510(3), . . . and 510(N−1) of the $1^{st}$ to $N^{th}$ stage shift registers 510(1)-510(N), and the gate driving circuit 500B includes the even-numbered stage shift registers 510(2), 510(4), . . . and 510(N) of the $1^{st}$ to $N^{th}$ stage shift registers 510(1)-510(N). In addition, the gate driving circuit 500A further includes clock signal lines L1 and L3, a starting signal line SLA1, an ending signal line SLA2 and a reset signal line RSLA, and the gate driving circuit 500B includes clock signal lines L2 and L4, a starting signal line SLB1, an ending signal line SLB2 and a reset signal line RSLB. In some embodiments, N is a multiple of 4. The clock signal lines L1-L4 respectively provide clock signals C1-C4 to the corresponding shift registers 510(1)-510(N). In the embodiments where N is a multiple of 4, the clock signal line L1 provides the clock signal C1 to the $1^{st}$ stage shift register 510(1), the $5^{th}$ stage shift register 510(5), . . . and the $(N-3)^{th}$ stage shift register 510(N−3) in the gate driving circuit 500A, the clock signal line L2 provides the clock signal C2 to the $2^{nd}$ stage shift register 510(2), the $6^{th}$ stage shift register 510(6), . . . and the $(N-2)^{th}$ stage shift register 510(N−2) in the gate driving circuit 500B, the clock signal line L3 provides the clock signal C3 to the $3^{rd}$ stage shift register 510(3), the $7^{th}$ stage shift register 510(7), . . . and the $(N-1)^{th}$ stage shift register 510(N−1) in the gate driving circuit 500A, and the clock signal line L4 provides the clock signal C4 to the $4^{th}$ stage shift register 510(4), the $8^{th}$ stage shift register 510(8), . . . and the $N^{th}$ stage shift register 510(N) in the gate driving circuit 500B. In addition, the starting signal lines SLA1 and SLB1 provide a starting signal STV1 to the $1^{st}$ and $2^{nd}$ stage shift registers 510(1) and 510(2), the ending signal lines SLA2 and SLB2 provide an ending signal STV2 to the $(N-1)^{th}$ and $N^{th}$ stage shift registers 510(N−1) and 510(N), and the reset signal lines RSLA and RSLB provide a reset signal RST to the $1^{st}$ to $N^{th}$ stage shift registers 510(1)-510(N). The clock signal lines L1-L4, the starting signal lines SLA1 and SLB1, the ending signal lines SLA2 and SLB2 and the reset signal lines RSLA and RSLB may be coupled to one or more chips. That is, the clock signals C1-C4, the starting signal STV1, the ending signal STV2 and the reset signal RST may be provided by the chip(s), such as a timing controller chip or a driving circuit, but are not limited thereto.

The $1^{st}$ to $N^{th}$ stage shift registers 510(1)-510(N) respectively generate $1^{st}$ to $N^{th}$ stage scan signals OUT(1)-OUT(N). The $1^{st}$ and $2^{nd}$ stage scan signals OUT(1) and OUT(2) are respectively inputted to the $3^{rd}$ and $4^{th}$ stage shift registers 510(3) and 510(4), the $(N-1)^{th}$ and $N^{th}$ scan signals OUT(N−1) and OUT(N) are respectively inputted to the $(N-3)^{th}$ and $(N-2)^{th}$ stage shift registers 510(N−3) and 510(N−2), and each of the $3^{rd}$ to $(N-2)^{th}$ stage scan signals OUT(3)-OUT(N−2) is inputted to the shift registers previous two stage of shift register thereto and next two stage of shift register thereto. For illustration, the $3^{rd}$ stage scan signal OUT(3) is inputted to the $1^{st}$ and $5^{th}$ shift registers 510(1) and 510(5).

In the aforementioned embodiments, the time sequential diagram of all signals (including the starting signal STV1, the clock signals C1-C4, the ending signal STV2, the reset signal RST, the pull-down control signal GPW1 and GPW2 and the $1^{st}$ stage to $N^{th}$ stage scan signals OUT(1)-OUT(N))

in the gate driving circuits 500A and 500B is the same as that shown in FIGS. 5-10, and thus the related descriptions thereof can refer to the preceding paragraphs, which are not repeated herein. In other embodiments, the signals respectively inputted by the starting signal line SLA1, the ending signal line SLA2 and the reset signal line RSLA of the gate driving circuit 500A may be at least partially different from those respectively inputted by the starting signal line SLB1, the ending signal line SLB2 and the reset signal line RSLB of the gate driving circuit 500B.

For example, in various embodiments, the reset signal lines RSLA and RSLB may respectively input different reset signals RST_A and RST_B. After the $(N-1)^{th}$ stage scan signal OUT(N-1) falls from a high voltage level to a low voltage level, the reset signal RST_A rises form the low voltage level to the high voltage level, so as to turn on the transistors M1 and M2 in the odd-numbered stage shift registers 510(1), 510(3), . . . and 510(N-1), and therefore the voltage levels of the nodes X1 and X2 of the odd-numbered stage shift registers 510(1), 510(3), . . . and 510(N-1) are reset to be the low voltage level. After the $N^{th}$ stage scan signal OUT(N) falls from a high voltage level to a low voltage level, the reset signal RST_B rises form the low voltage level to the high voltage level, so as to turn on the transistors M1 and M2 in the even-numbered stage shift registers 510(2), 510(4), . . . and 510(N), and therefore the voltage levels of the nodes X1 and X2 of the odd-numbered stage shift registers 510(2), 510(4), . . . and 510(N) are reset to be the low voltage level. The time point at which the reset signal RST_A rises form the low voltage level to the high voltage level is different form the time point at which the reset signal RST_B rises form the low voltage level to the high voltage level.

Summarizing the above, in the embodiments, the two reset signal lines RSLA and RSLB are respectively coupled to the odd-numbered stage shift registers and the even-numbered stage shift registers, and the reset signal RST is inputted into the reset signal lines RSLA and RSLB, such that the reset signal RST rises form the low voltage level to the high voltage level after the $N^{th}$ stage scan signal OUT(N) falls from the high voltage level to the low voltage level, so as to reset the voltage levels of the nodes X1 and X2 of each of the shift registers 510(1)-510(N) to be the low voltage level; alternatively, the two reset signals RST_A and RST_B are respectively inputted into the reset signal lines RSLA and RSLB, such that the reset signals RST_A and RST_B rise from the low voltage level to the high voltage level respectively after the $(N-1)^{th}$ stage scan signal OUT(N-1) and the $N^{th}$ stage scan signal OUT(N) fall from the high voltage level to the low voltage level, so as to reset the voltage levels of the nodes X1 and X2 of each of the shift registers 510(1)-510(N) to be the low voltage level.

Figure 14:
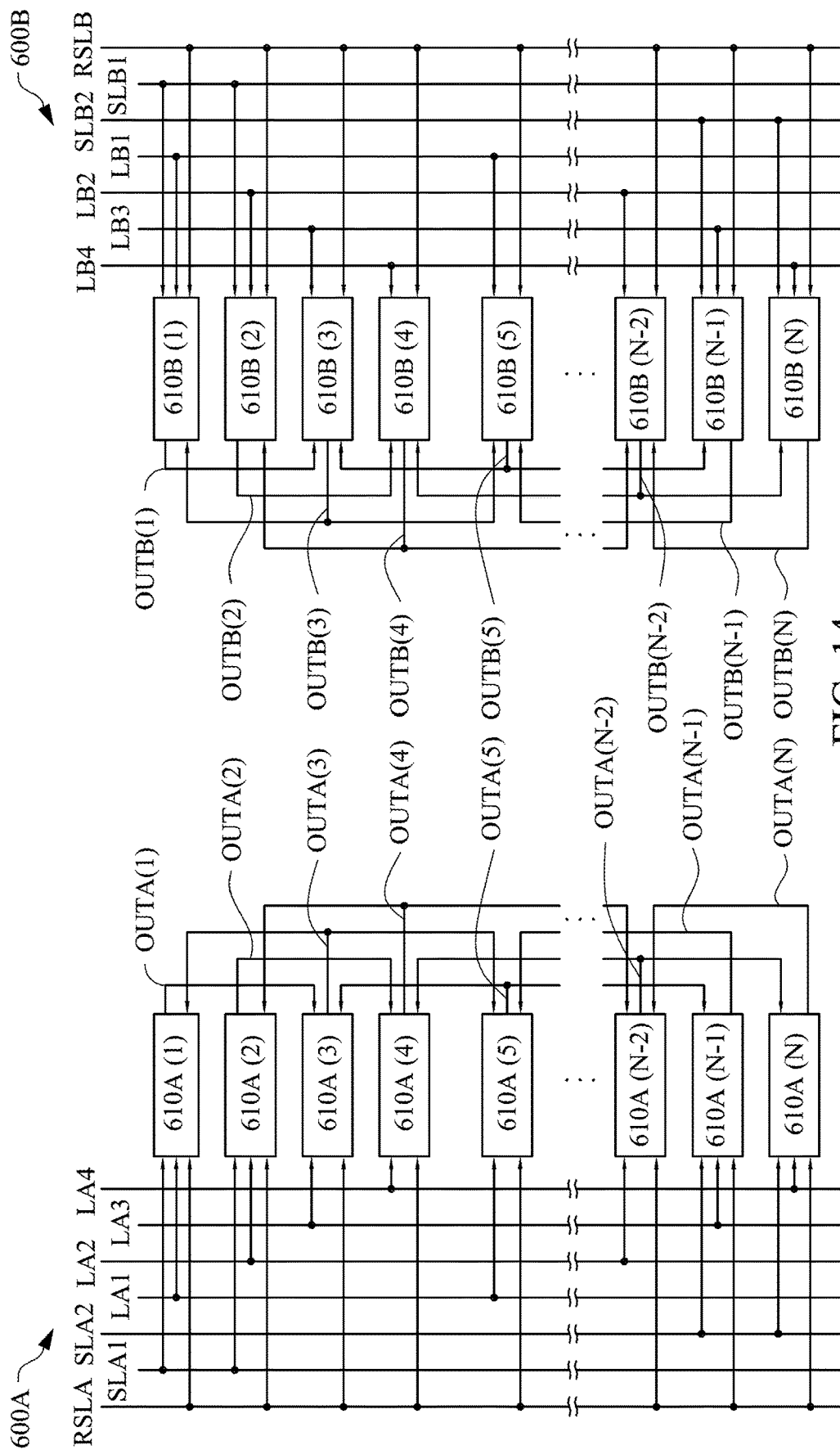
FIG. 14 is a schematic diagram of a gate driving circuit in accordance with some embodiments of the invention.

Referring to FIG. 14, which illustrates a schematic diagram of gate driving circuits 600A and 600B in accordance with some embodiments of the invention. The gate driving circuits 600A and 600B may be applied to the display device 400 in FIG. 11 or FIG. 12, or another similar display device. In the following, the gate driving circuits 600A and 600B applied to the display device 400 in FIG. 12 are exemplified for description. The gate driving circuits 600A and 600B are parts of the gate drivers 430A and 430B, respectively, and respectively drive the pixels PX in the display region 410A at two opposite sides of the display panel 410, so as to enhance the driving ability to the display panel 410. The gate driving circuits 600A and 600B respectively include $1^{st}$ to $N^{th}$ stage shift registers 610A(1)-610A(N) and $1^{st}$ to $N^{th}$ stage shift registers 610B(1)-610B(N), where N is an integer greater than or equal to 5. The $1^{st}$ to $N^{th}$ stage shift registers 610A(1)-610A(N) and the $1^{st}$ to $N^{th}$ stage shift registers 610B(1)-610B(N) are a GOA circuit structure. The equivalent circuits of the shift registers 610A(1)-610A(N) and 610B(1)-610B(N) are the same as the equivalent circuit of the shift register 210(i) in FIG. 4. In addition, the gate driving circuit 600A further includes clock signal lines LA1-LA4 and, a starting signal line SLA1, an ending signal line SLA2 and a reset signal line RSLA, and the gate driving circuit 600B includes clock signal lines LB1-LB4, a starting signal line SLB1, an ending signal line SLB2 and a reset signal line RSLB. In some embodiments, N is a multiple of 4. The clock signal lines LA1-LA4 and LB1-LB4 respectively provide clock signals C1-C4 to the corresponding shift registers 610A(1)-610A(N) and 610B(1)-610B(N). In the embodiments where N is a multiple of 4, the clock signal lines LA1 and LB1 provide the clock signal C1 to the $1^{st}$ stage shift registers 610A(1) and 610B(1), the $5^{th}$ stage shift registers 610A(5) and 610B(5), . . . and the $(N-3)^{th}$ stage shift registers 610A(N-3) and 610B(N-3) respectively in the gate driving circuits 600A and 600B, the clock signal lines LA2 and LB2 provide the clock signal C2 to the $2^{nd}$ stage shift registers 610A(2) and 610B(2), the $6^{th}$ stage shift registers 610A(6) and 610B(6), . . . and the $(N-2)^{th}$ stage shift registers 610A(N-2) and 610B(N-2) respectively in the gate driving circuits 600A and 600B, the clock signal lines LA3 and LB3 provide the clock signal C3 to the $3^{rd}$ stage shift registers 610A(3) and 610B(3), the $7^{th}$ stage shift registers 610A(7) and 610B(7), . . . and the $(N-1)^{th}$ stage shift registers 610A(N-1) and 610B(N-1) respectively in the gate driving circuits 600A and 6006, and the clock signal lines LA4/LB4 provide the clock signal C4 to the $4^{th}$ stage shift registers 610A(4) and 610B(4), the $8^{th}$ stage shift registers 610A(8) and 610B(8), . . . and the $N^{th}$ stage shift registers 610A(N) and 610B(N) respectively in the gate driving circuits 600A and 6006. In addition, the starting signal line SLA1 provides a starting signal STV1 to the $1^{st}$ and $2^{nd}$ stage shift registers 610A(1) and 610A(2), the starting signal line SLB1 provides the starting signal STV1 to the $1^{st}$ and $2^{nd}$ stage shift registers 610B(1) and 610B(2), the ending signal line SLA2 provides an ending signal STV2 to the $(N-1)^{th}$ and $N^{th}$ stage shift registers 610A(N-1) and 610A(N), the ending signal line SLB2 provides the ending signal STV2 to the $(N-1)^{th}$ and $N^{th}$ stage shift registers 610B(N-1) and 610B(N), and the reset signal lines RSLA and RSLB provide a reset signals RST to the $1^{st}$ to $N^{th}$ stage shift registers 610A(1)-610A(N) and the $1^{st}$ to $N^{th}$ stage shift registers 610B(1)-610B(N). The clock signal lines LA1-LA4 and LB1-LB4, the starting signal lines SLA1 and SLB1, the ending signal lines SLA2 and SLB2 and the reset signal lines RSLA and RSLB may be coupled to one or more chips. That is, the clock signals C1-C4, the starting signal STV1, the ending signal STV2 and the reset signal RST may be provided by the chip(s), such as a timing controller chip or a driving circuit, but are not limited thereto.

The $1^{st}$ to $N^{th}$ stage shift registers 610A(1)-610A(N) and the $1^{st}$ to $N^{th}$ stage shift registers 610B(1)-610B(N) respectively generate $1^{st}$ to $N^{th}$ stage scan signals OUTA(1)-OUTA(N) and $1^{st}$ to $N^{th}$ stage scan signals OUTB(1)-OUTB(N) to corresponding $1^{st}$ to $N^{th}$ gate lines. For example, the two terminals of an $i^{th}$ gate line of the $1^{st}$ to $N^{th}$ gate lines are electrically connected to a corresponding $i^{th}$ stage shift register 610A(i) of the $1^{st}$ to $N^{th}$ stage shift registers 610A(1)-610A(N) and a corresponding $i^{th}$ stage shift register 610B(i) of the $1^{st}$ to $N^{th}$ stage shift registers 610B(1)-610B(N), respectively. In other words, each gate line is driven simultaneously by two corresponding shift registers to improve the gate line voltage level driving ability in order to switch the voltage level of the gate lines from a disabling voltage level (e.g. low voltage level) to an enabling voltage level (e.g. high voltage level) in a short time, and the waveform of the gate line voltage is not distorted. The $1^{st}$ and $2^{nd}$ stage scan signals OUTA(1), OUTB(1), OUTA(2) and OUTB(2) are respectively inputted to the $3^{rd}$ and $4^{th}$ stage shift registers 610A(3), 610B(3), 610A(4) and 610B(4), the $(N-1)^{th}$ and $N^{th}$ scan signals OUTA(N-1), OUTB(N-1), OUTA(N) and OUTB(N) are respectively inputted to the $(N-3)^{th}$ and $(N-2)^{th}$ stage shift registers 610A(N-3), 610B(N-3), 610A(N-2) and 610B(N-2), and each of the $3^{rd}$ to $(N-2)^{th}$ stage scan signals OUTA(3)-OUTA(N-2) of the $3^{rd}$ to $(N-2)^{th}$ stage scan signals OUTB(3)-OUTB(N-2) is inputted to the shift registers previous two stage of shift register thereto and next two stage of shift register thereto. For illustration, the $3^{rd}$ stage scan signal OUTA(3) is inputted to the $1^{st}$ and $5^{th}$ shift registers 610A(1) and 610A(5).

The same stage of those among the scan signals OUTA(1)-OUTA(N) and OUTB(1)-OUTB(N) have the same waveform time sequential diagram; that is, the $1^{st}$ stage scan signals OUTA(1) and OUTB(1) have the same waveform time sequential diagram, the $2^{nd}$ stage scan signals OUTA(2) and OUTB(2) have the same waveform time sequential diagram, . . . and the like. In addition, the clock signals C1-C4, the starting signal STV1, the ending signal STV2, the pull-down control signals GPW1 and GPW2, the reset signal RST and the $1^{st}$ to $N^{th}$ stage scan signals OUTA(1)-OUTA(N)/OUTB(1)-OUTB(N) in the gate driving circuit 600A/600B may respectively have the same waveform time sequential diagrams as those of the clock signals C1-C4, the starting signal STV1, the ending signal STV2, the pull-down control signal GPW1 and GPW2, the reset signal RST and the $1^{st}$ to $N^{th}$ stage scan signals OUT(1)-OUT(N) in the gate driving circuit 200, and thus the related descriptions thereof can refer to the preceding paragraphs, which are not repeated herein.

In summary, the gate driving circuit of the invention and the display panel with such gate driving circuit have voltage level reset function, which can prevent the shift registers from being affected by noise interferences to output abnormal scan signals, ensuring that the display panel displays correct images in each frame period.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A gate driving circuit, comprising:
    $1^{st}$ to $N^{th}$ stage shift registers configured to respectively provide $1^{st}$ to $N^{th}$ stage scan signals to $1^{st}$ to $N^{th}$ gate lines of a display panel, wherein N is an integer greater than 1;
    wherein an $i^{th}$ stage shift register of the $1^{st}$ to $N^{th}$ stage shift registers comprises:
        a pre-charge unit that is coupled to a first node and is configured to output a pre-charge signal to the first node;
        a pull-up unit that is coupled to the first node and a second node and is configured to output an $i^{th}$ stage scan signal of the $1^{st}$ to $N^{th}$ stage scan signals to the second node; and
        a reset unit that is coupled to the first node and the second node and is configured to receive a reset signal;
    wherein the display panel sequentially displays $1^{st}$ to $M^{th}$ frames after switching from a sleep mode to a restart mode, the voltage level of the reset signal switches after the display panel switches from the sleep mode to the restart mode and before the $1^{st}$ frame of the $1^{st}$ to $M^{th}$ frames is displayed, wherein M is an integer that is greater than or equal to 2, and i is an integer that is greater than or equal to 1 and is smaller than or equal to N.

2. The gate driving circuit of claim 1, wherein the reset unit resets voltage levels of the first node and the second node after the voltage level of the reset signal switches.

3. The gate driving circuit of claim 1, further comprising at least one reset line that is coupled to the reset unit of each of the 1st to Nth stage shift registers.

4. The gate driving circuit of claim 1, wherein the voltage level of the reset signal further switches between two adjacent frames of the $1^{st}$ to $M^{th}$ frames.

5. The gate driving circuit of claim 1, wherein the display panel sequentially displays $1^{st}$ to $K^{th}$ frames after a power-on operation, and the voltage level of the reset signal switches before the $1^{st}$ frame of the $1^{st}$ to $K^{th}$ frames is displayed, wherein K is an integer that is greater than or equal to 2.

6. The gate driving circuit of claim 1, wherein the reset unit comprises:
    a first transistor, wherein a control terminal of the first transistor is configured to receive the reset signal, a first terminal of the first transistor is coupled to a reference voltage, and a second terminal of the first transistor is coupled to the first node; and
    a second transistor, wherein a control terminal of the second transistor is configured to receive the reset signal, a first terminal of the second transistor is coupled to the reference voltage, and a second terminal of the second transistor is coupled to the second node.

7. The gate driving circuit of claim 1, wherein the pull-up unit comprises:
    a third transistor, wherein a control terminal of the third transistor is coupled to the first node and is configured to receive the pre-charge signal, a first terminal of the third transistor is configured to receive a clock signal, and a second terminal of the third transistor is coupled to the second node and is configured to output the scan signal.

8. The gate driving circuit of claim 7, wherein the pull-up unit further comprises:
    a capacitor, wherein a first terminal of the capacitor is coupled to the control terminal of the third transistor, and a second terminal of the capacitor is coupled to the second terminal of the third transistor.

9. The gate driving circuit of claim 1, wherein the pre-charge unit comprises:
    a fourth transistor, wherein a control terminal of the fourth transistor is configured to receive a first input signal, a first terminal of the fourth transistor is configured to receive a forward input signal, and a second terminal of the fourth transistor is coupled to the first node; and
    a fifth transistor, wherein a control terminal of the fifth transistor is configured to receive a second input signal, a first terminal of the fifth transistor is configured to receive a backward input signal, and a second terminal of the fifth transistor is coupled to the second terminal of the fourth transistor.

10. The gate driving circuit of claim 1, wherein the pre-charge unit comprises:
   a fourth transistor, wherein a control terminal of the fourth transistor is configured to receive a first input signal, a first terminal of the fourth transistor is coupled to a voltage source, and a second terminal of the fourth transistor is coupled to the first node.

11. The gate driving circuit of claim 1, wherein the $i^{th}$ stage shift register further comprises:
   a first pull-down unit that is coupled to the first node and the second node and is configured to receive a first pull-down control signal and a second pull-down control signal; and
   a second pull-down unit that is coupled to the first node and the second node and is configured to receive the first pull-down control signal and the second pull-down control signal;
   wherein the first pull-down control signal and the second pull-down control signal are phase-inverted from each other in each frame period of the display panel.

12. A display panel having a display area and a non-display area, the display panel comprising:
   a substrate;
   a plurality of gate lines and a plurality of data lines disposed on the substrate, wherein the plurality of gate lines have $1^{st}$ to $N^{th}$ gate lines, wherein N is an integer greater than 1;
   a first set of $1^{st}$ to $N^{th}$ stage shift registers that are disposed on the substrate and in the non-display area and are configured to respectively provide $1^{st}$ to $N^{th}$ stage scan signals to the $1^{st}$ to $N^{th}$ gate lines; and
   at least one reset line that is disposed on the substrate and in the non-display area and is coupled to the $1^{st}$ to $N^{th}$ stage shift registers;
   wherein an $i^{th}$ stage shift register of the first set of $1^{st}$ to $N^{th}$ stage shift registers comprises:
      a pre-charge unit that is coupled to a first node and is configured to output a pre-charge signal to the first node;
      a pull-up unit that is coupled to the first node and a second node and is configured to output an $i^{th}$ stage scan signal of the $1^{st}$ to $N^{th}$ stage scan signals to the second node; and
      a reset unit that is coupled to the first node, the second node and the reset line and is configured to provide a reset signal to the reset unit;
   wherein the display panel sequentially displays $1^{st}$ to $M^{th}$ frames after switching from a sleep mode to a restart mode, the voltage level of the reset signal switches after the display panel switches from the sleep mode to the restart mode and before the $1^{st}$ frame of the $1^{st}$ to $M^{th}$ frames is displayed, wherein M is an integer that is greater than or equal to 2, and i is an integer that is greater than or equal to 1 and is smaller than or equal to N.

13. The display panel of claim 12, wherein the first set of $1^{st}$ to $N^{th}$ stage shift registers are a gate driver on array (GOA).

14. The display panel of claim 12, wherein the voltage level of the reset signal further switches between two adjacent frames of the $1^{st}$ to $M^{th}$ frames.

15. The display panel of claim 12, wherein the voltage level of the reset signal further switches before the display panel switches from a non-display status to a display status.

16. The display panel of claim 12, wherein a plurality of odd-numbered stage shift registers and a plurality of even-numbered stage shift registers of the first set of $1^{st}$ to $N^{th}$ stage shift registers are disposed at two opposite sides of the display panel, respectively, and the at least one reset line comprises a first reset line and a second reset line, wherein the first reset line and the second reset line are coupled to the plurality of odd-numbered stage shift registers and the plurality of even-numbered stage shift registers, respectively, and the first reset line and the second reset line are configured to provide the reset signal to the plurality of odd-numbered stage shift registers and the plurality of even-numbered stage shift registers, respectively.

17. The display panel of claim 12, further comprising a second set of $1^{st}$ to $N^{th}$ stage shift registers;
   wherein the first set of $1^{st}$ to $N^{th}$ stage shift registers and the second set of $1^{st}$ to $N^{th}$ stage shift registers are disposed at two opposite sides of the display panel, and the at least one reset line comprises a first reset line and a second reset line that are respectively coupled to and provide the reset signal to the first set of $1^{st}$ to $N^{th}$ stage shift registers and the second set of $1^{st}$ to $N^{th}$ stage shift registers;
   wherein an $i^{th}$ gate line of the $1^{st}$ to $N^{th}$ gate lines is electrically connected to an $i^{th}$ stage shift register of the first set of $1^{st}$ to $N^{th}$ stage shift registers and an $i^{th}$ stage shift register of the second set of $1^{st}$ to $N^{th}$ stage shift registers.

18. A display panel having a display area and a non-display area, the display panel comprising:
   a substrate;
   a plurality of gate lines and a plurality of data lines disposed on the substrate, the plurality of gate lines having $1^{st}$ to $N^{th}$ gate lines, wherein N is an integer greater than 1;
   $1^{st}$ to $N^{th}$ stage shift registers disposed on the substrate and in the non-display area and are configured to respectively provide $1^{st}$ to $N^{th}$ stage scan signals to the $1^{st}$ to $N^{th}$ gate lines, wherein a plurality of odd-numbered stage shift registers and a plurality of even-numbered stage shift registers of the $1^{st}$ to $N^{th}$ stage shift registers are disposed at two opposite sides of the display panel, respectively, and wherein the plurality of odd-numbered stage shift registers and the plurality of even-numbered stage shift registers are coupled to odd-numbered gate lines and even-numbered gate lines of the $1^{st}$ to $N^{th}$ gate lines, respectively; and
   a first reset line and a second reset line that are disposed on the substrate and in the non-display area and are configured to respectively provide a first reset signal and a second reset signal to the plurality of odd-numbered stage shift registers and the plurality of even-numbered stage shift registers;
   wherein an $i^{th}$ stage shift register of the $1^{st}$ to $N^{th}$ stage shift registers comprises:
      a pre-charge unit that is coupled to a first node and is configured to output a pre-charge signal to the first node;
      a pull-up unit that is coupled to the first node and a second node and is configured to output an $i^{th}$ stage scan signal of the $1^{st}$ to $N^{th}$ stage scan signals to the second node; and
      a reset unit that is coupled to the first node, the second node and the first reset line or the second reset line;
   wherein the display panel sequentially displays $1^{st}$ to $M^{th}$ frames after switching from a sleep mode to a restart mode, each of the voltage levels of the first reset signal and the second reset signal switches after the display panel switches from the sleep mode to the restart mode and before the $1^{st}$ frame is displayed, wherein M is an integer that is greater than or equal to 2, and i is an integer that is greater than or equal to 1 and is smaller than or equal to N.

* * * * *